(12) United States Patent
Ishii et al.

(10) Patent No.: US 11,923,020 B2
(45) Date of Patent: Mar. 5, 2024

(54) MEMORY DEVICE AND MEMORY SYSTEM

(71) Applicant: Kioxia Corporation, Tokyo (JP)

(72) Inventors: Hiroyuki Ishii, Kanagawa (JP); Yuji Nagai, Kanagawa (JP); Makoto Miakashi, Kanagawa (JP); Tomoko Kajiyama, Kanagawa (JP); Hayato Konno, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 190 days.

(21) Appl. No.: 17/679,667

(22) Filed: Feb. 24, 2022

(65) Prior Publication Data

US 2023/0057303 A1    Feb. 23, 2023

(30) Foreign Application Priority Data

Aug. 17, 2021    (JP) ................. 2021-132851

(51) Int. Cl.
| | |
|---|---|
| G11C 16/04 | (2006.01) |
| G11C 16/08 | (2006.01) |
| G11C 16/10 | (2006.01) |
| G11C 16/26 | (2006.01) |
| G11C 16/34 | (2006.01) |

(52) U.S. Cl.
CPC .......... G11C 16/3459 (2013.01); G11C 16/08 (2013.01); G11C 16/102 (2013.01); G11C 16/26 (2013.01); G11C 16/3404 (2013.01)

(58) Field of Classification Search
CPC ... G11C 16/3459; G11C 16/08; G11C 16/102; G11C 16/26; G11C 16/3404
See application file for complete search history.

(56) References Cited

U.S. PATENT DOCUMENTS

| | | | |
|---|---|---|---|
| 7,307,884 B2 | 12/2007 | Guterman | |
| 7,391,649 B2 | 6/2008 | Kang et al. | |
| 10,109,355 B2 | 10/2018 | Nagao | |
| 2022/0093199 A1* | 3/2022 | Shirakawa | ........... G11C 29/021 |
| 2022/0246200 A1* | 8/2022 | Kim | ................. G11C 11/40615 |
| 2023/0298641 A1* | 9/2023 | Hayashi | ............... G11C 7/1069 |
| | | | 365/189.011 |

FOREIGN PATENT DOCUMENTS

| | | |
|---|---|---|
| JP | 2008-503025 A | 1/2008 |
| JP | 2013-012298 A | 1/2013 |
| JP | 2018-147535 A | 9/2018 |

* cited by examiner

*Primary Examiner* — Pho M Luu

(74) *Attorney, Agent, or Firm* — Foley & Lardner LLP

(57) ABSTRACT

A memory device includes a plurality of memory cell transistors, a first word line, a controller, and a storage circuit. Each of the plurality of memory cell transistors stores a plurality of pieces of bit data. The first word line is connected to a plurality of first memory cell transistors in the plurality of memory cell transistors. The controller performs a loop process including repetition of a program loop including a program operation and a first verification operation. The storage circuit stores status information. The controller performs the loop process, then performs a second verification operation, and stores first status data corresponding to a result of the loop process and second status data corresponding to a result of the second verification operation in the storage circuit, in a write operation using the plurality of first memory cell transistors as targets.

18 Claims, 20 Drawing Sheets

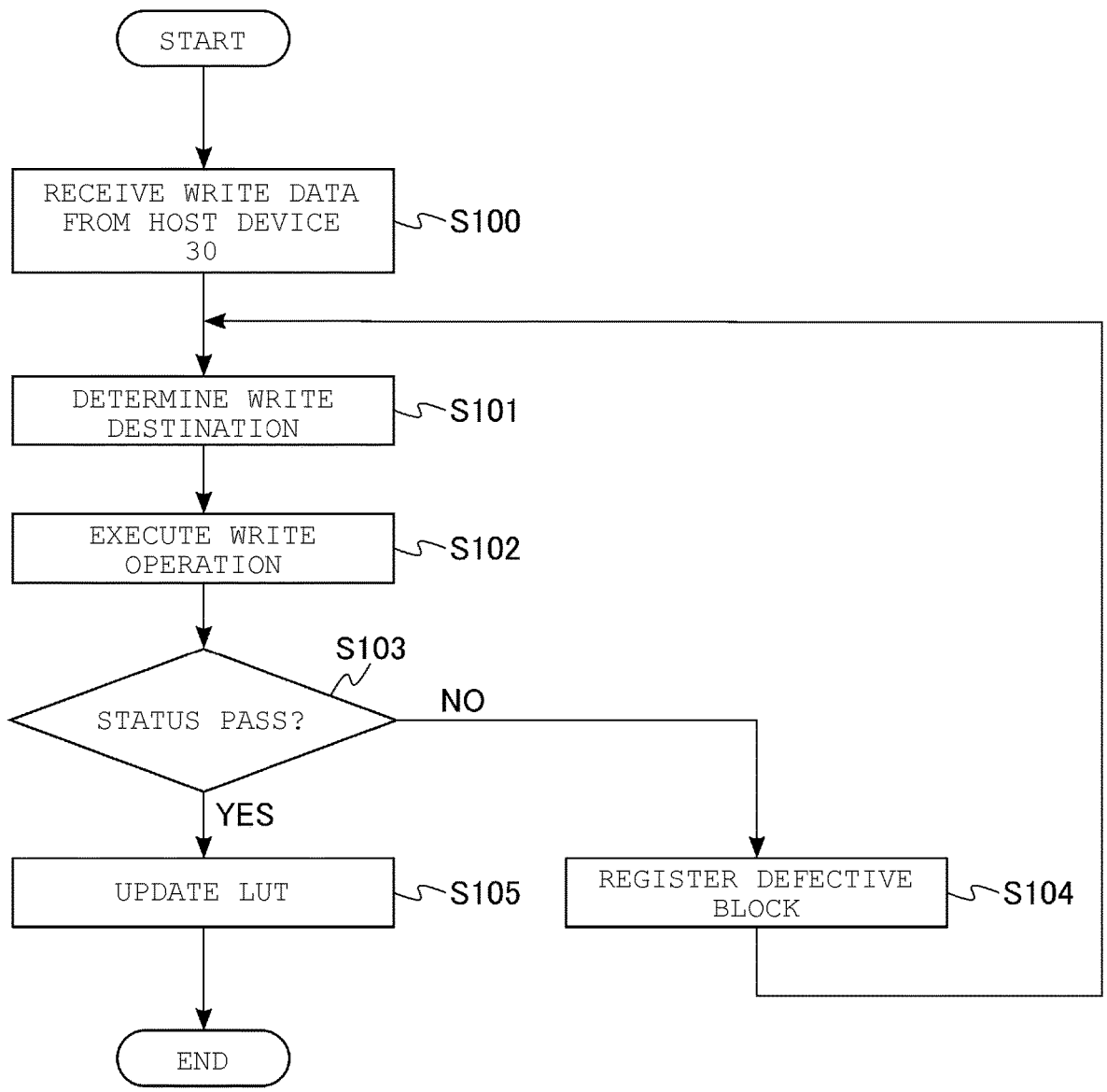

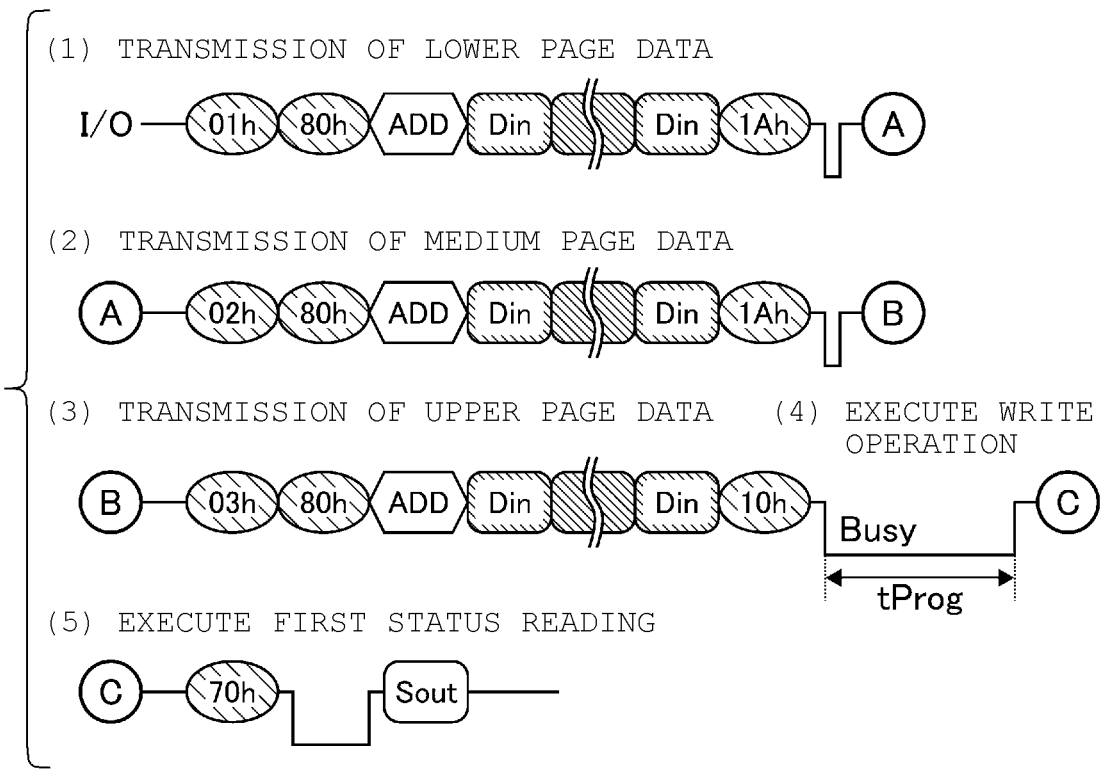

FIG. 16
| TARGET PAGE OF SECOND VERIFICATION OPERATION | TARGET STATE OF SECOND VERIFICATION OPERATION | | | | | | |
|---|---|---|---|---|---|---|---|
| | S1 | S2 | S3 | S4 | S5 | S6 | S7 |
| UPPER PAGE | | | O | | | | O |
| MEDIUM PAGE | | O | | O | | O | |
| LOWER PAGE | O | | | | O | | |
FIG. 17
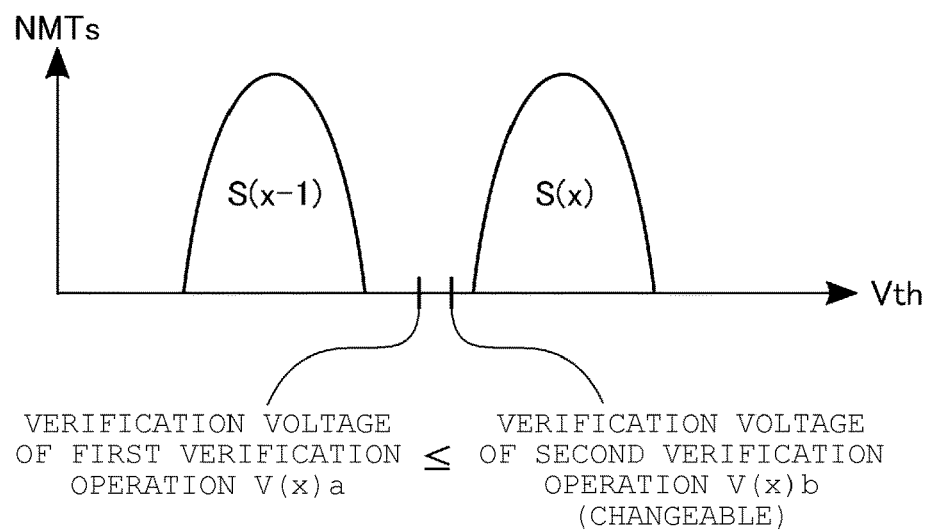
FIG. 18
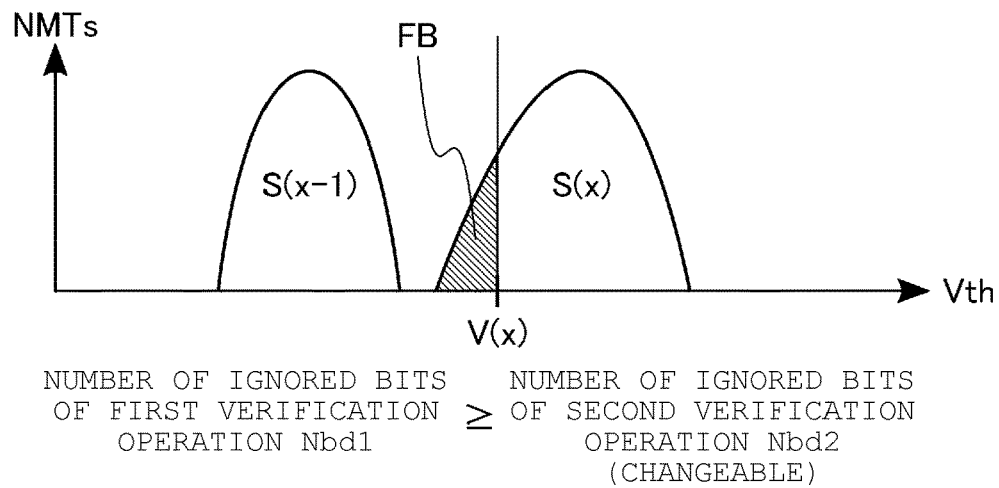

| I/O0 | I/O1 | I/O2 | I/O3 | I/O4 | I/O5 | I/O6 | I/O7 |
|---|---|---|---|---|---|---|---|
| WRITE RESULT | PROGRAM FAIL (Loop Max) | SECOND VERIFI-CATION RESULT | 0 | 0 | True busyn | Cache busyn | WPn |

| I/O0 | I/O1 | I/O2 | I/O3 | I/O4 | I/O5 | I/O6 | I/O7 |
|---|---|---|---|---|---|---|---|
| WRITE RESULT | PROGRAM FAIL (Loop Max) | SECOND VERIFI-CATION RESULT OF FIRST TIME | SECOND VERIFI-CATION RESULT OF SECOND TIME | 0 | True busyn | Cache busyn | WPn |

MEMORY DEVICE AND MEMORY SYSTEM

CROSS-REFERENCE TO RELATED APPLICATION

This application is based upon and claims the benefit of priority from Japanese Patent Application No. 2021-132851, filed Aug. 17, 2021, the entire contents of which are incorporated herein by reference.

FIELD

Embodiments described herein relate generally to a memory device and a memory system.

BACKGROUND

A NAND flash memory that can store data in a non-volatile manner is known.

DESCRIPTION OF THE DRAWINGS

FIG. 10 is a flowchart illustrating an example of a write operation of the memory system according to the first embodiment.

FIG. 11 is a schematic diagram illustrating an example of a command sequence in the write operation of the memory system according to the first embodiment.

FIG. 12 is a table showing an example of status information output from the memory device in the write operation of the memory system according to the first embodiment.

FIG. 16 is a table showing an example of a combination of a target page in a second verification operation and a target state of the second verification operation in the write operation according to a first modification of the first embodiment.

FIG. 17 is a threshold voltage distribution diagram illustrating an example of settings of verification voltages used in a first verification operation and the second verification operation in the write operation according to a second modification of the first embodiment.

FIG. 18 is a threshold voltage distribution diagram illustrating an example of a setting of the number of ignored bits in the write operation according to a third modification of the first embodiment.

DETAILED DESCRIPTION

Figure 1:
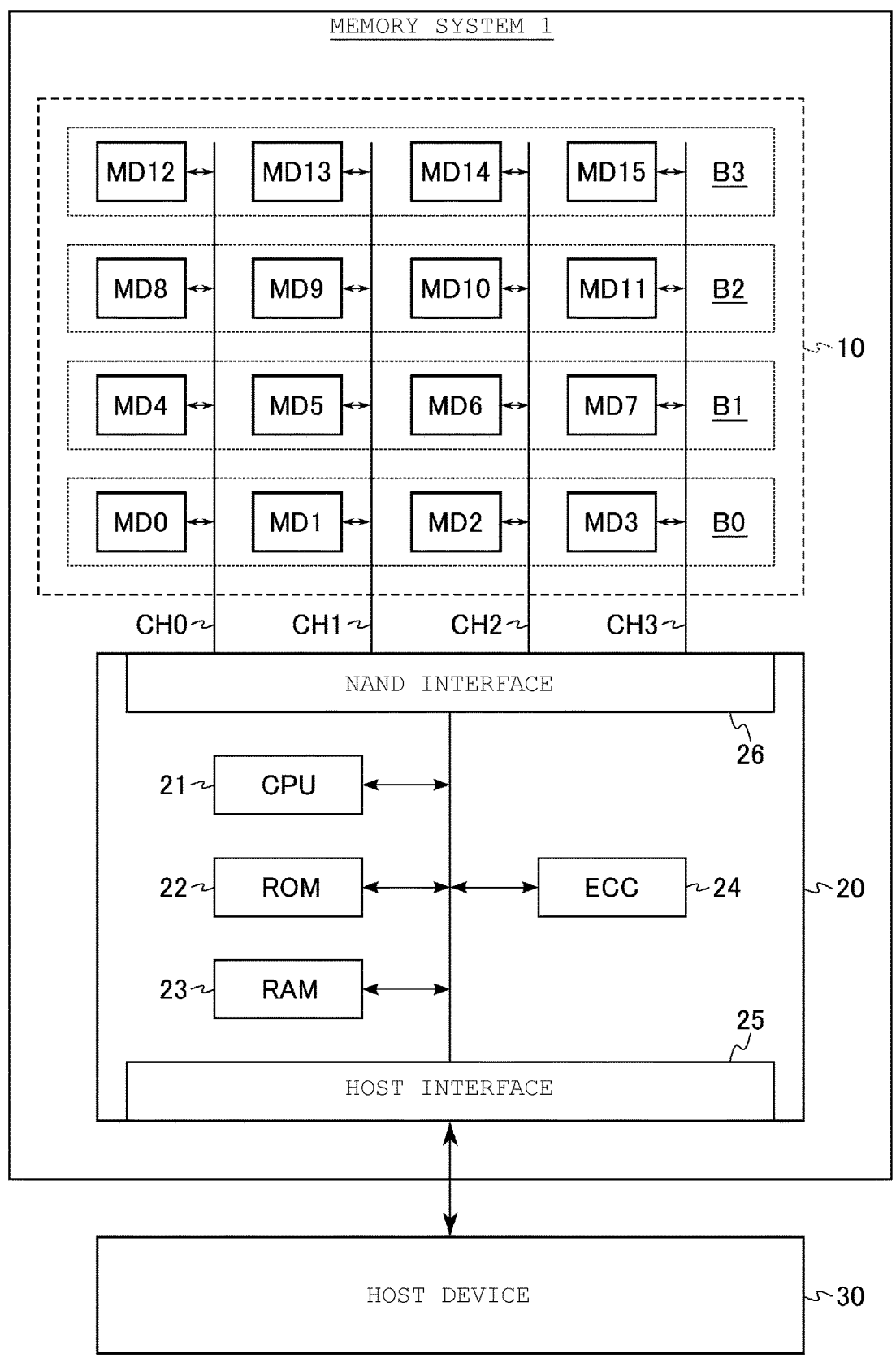
FIG. 1 is a block diagram illustrating an example of a configuration of a memory system according to a first embodiment.

Embodiments provide an improvement in reliability of data.

In general, according to at least one embodiment, a memory device includes a plurality of memory cell transistors, a first word line, a controller, and a storage circuit. Each of the plurality of memory cell transistors stores a plurality of pieces of bit data. The first word line is connected to a plurality of first memory cell transistors in the plurality of memory cell transistors. The controller performs a loop process including repetition of a program loop including a program operation and a first verification operation. The storage circuit stores status information. The controller performs the loop process, then performs a second verification operation, and stores first status data corresponding to a result of the loop process and second status data corresponding to a result of the second verification operation in the storage circuit, during a write operation using the plurality of first memory cell transistors as targets.

Hereinafter, embodiments are described with reference to the drawings. Each embodiment exemplifies a device or method for embodying the technical idea of the disclosure.

The diagrams are schematic or conceptual, and the dimensions and ratios of each diagram are not necessarily the same as those in reality. The technical idea of the present disclosure is not specified by the shape, structure, arrangement, and the like of the components.

Further, in the following explanation, the same reference numeral is given to the components having substantially the same function and configuration. Numbers after characters that configure the reference numerals are used to distinguish between elements that are referenced by a reference numeral that includes the same character and have a similar configuration. In the same manner, characters after the numbers that configure the reference codes are used to distinguish between elements that are referenced by a reference code that includes the same number and have a similar configuration.

[1] First Embodiment

Hereinafter, a memory system 1 according to a first embodiment is described.

[1-1] Configuration

[1-1-1] Overall Configuration of Memory System 1

FIG. 1 is a block diagram illustrating an example of the configuration of the memory system 1 according to the first embodiment. As illustrated in FIG. 1, the memory system 1 includes, for example, a memory set 10 and a memory controller 20. The memory system 1 is connected to an external host device 30 and can perform an operation in accordance with an instruction from the host device 30.

The memory set 10 includes a plurality of memory devices MD0 to MD15. The memory devices MD are NAND flash memories that store data in a non-volatile manner and are formed on semiconductor chips different from each other. The number of memory devices MD in the memory set 10 can be any number. The detailed configuration of the memory device MD is described below.

The memory controller 20 is, for example, a system on chip (SoC), and instructs the memory devices MD0 to MD15 to perform reading, writing, erasing, and the like in response to the instruction from the host device 30. The memory controller 20 includes, for example, a central processing unit (CPU) 21, a read only memory (ROM) 22, a random access memory (RAM) 23, an error correction code (ECC) circuit 24, a host interface circuit 25, and a NAND interface circuit 26.

The CPU 21 controls operation of the entire memory controller 20. For example, the CPU 21 issues a command in accordance with the instruction received from the host device 30 and transmits the issued command to the memory devices MD. The CPU 21 can perform various processes for managing storage spaces of the memory devices MD such as garbage collection or wear leveling.

The ROM 22 is a read-only storage device that stores data in a non-volatile manner. For example, the ROM 22 stores control programs, control data, or the like of the memory controller 20.

The RAM 23 is a storage device used as a work area of the CPU 21. For example, the RAM 23 stores a look-up table LUT for managing storage regions of the memory devices MD. For example, a volatile memory such as a dynamic random access memory (DRAM) or a static random access memory (SRAM) is used as the RAM 23. The RAM 23 is used as a temporary storage region of the memory controller 20. For example, the RAM 23 temporarily stores write data received from the host device 30, read data received from the memory devices MD, or the like. Further, a storage device such as the RAM 23 may be externally connected to the memory controller 20.

The ECC circuit 24 performs a data error correction process. For example, during the write operation, the ECC circuit 24 generates a parity based on the write data received from the host device 30 and places the generated parity in the write data. During the read operation, the ECC circuit 24 generates a syndrome based on the read data received from the memory devices MD and detects and corrects errors of read data based on the generated syndrome.

The host interface circuit 25 is connected to the host device 30 and controls transfer of data, commands, and addresses between the memory controller 20 and the host device 30. The host interface circuit 25 may support communication interface standards such as a serial advanced technology attachment (SATA), a serial attached SCSI (SAS), and a PCI express (PCIe)™.

The NAND interface circuit 26 is connected to the memory devices MD and controls transfer of data, commands, and addresses between the memory devices MD and the memory controller 20. The connection between the NAND interface circuit 26 and the memory devices MD supports the NAND interface standard. For example, the NAND interface circuit 26 includes channels CH0 to CH3 that can be controlled in parallel. The channel CH0 is connected to the memory devices MD0, MD4, MD8, and MD12. The channel CH1 is connected to the memory devices MD1, MD5, MD9, and MD13. The channel CH2 is connected to the memory devices MD2, MD6, MD10, and MD14. The channel CH3 is connected to the memory devices MD3, MD7, MD11, and MD15.

For example, a set of the plurality of memory devices MD controlled in parallel is referred to as a "bank". In the present example, the memory set 10 includes four banks B0 to B3. The bank B0 includes the memory devices MD0 to MD3, the bank B1 includes the memory devices MD4 to MD7, the bank B2 includes the memory devices MD8 to MD11, and the bank B3 includes the memory devices MD12 to MD15. The plurality of memory devices MD connected to the common channel CH can be operated in parallel except for an operation accompanied by communication between the memory devices MD and the NAND interface circuit 26. The number of memory devices MD provided in the memory set 10 and the configurations of the banks and the channels may be freely selected and designed.

[1-1-2] Configuration of Memory Devices MD

Figure 2:
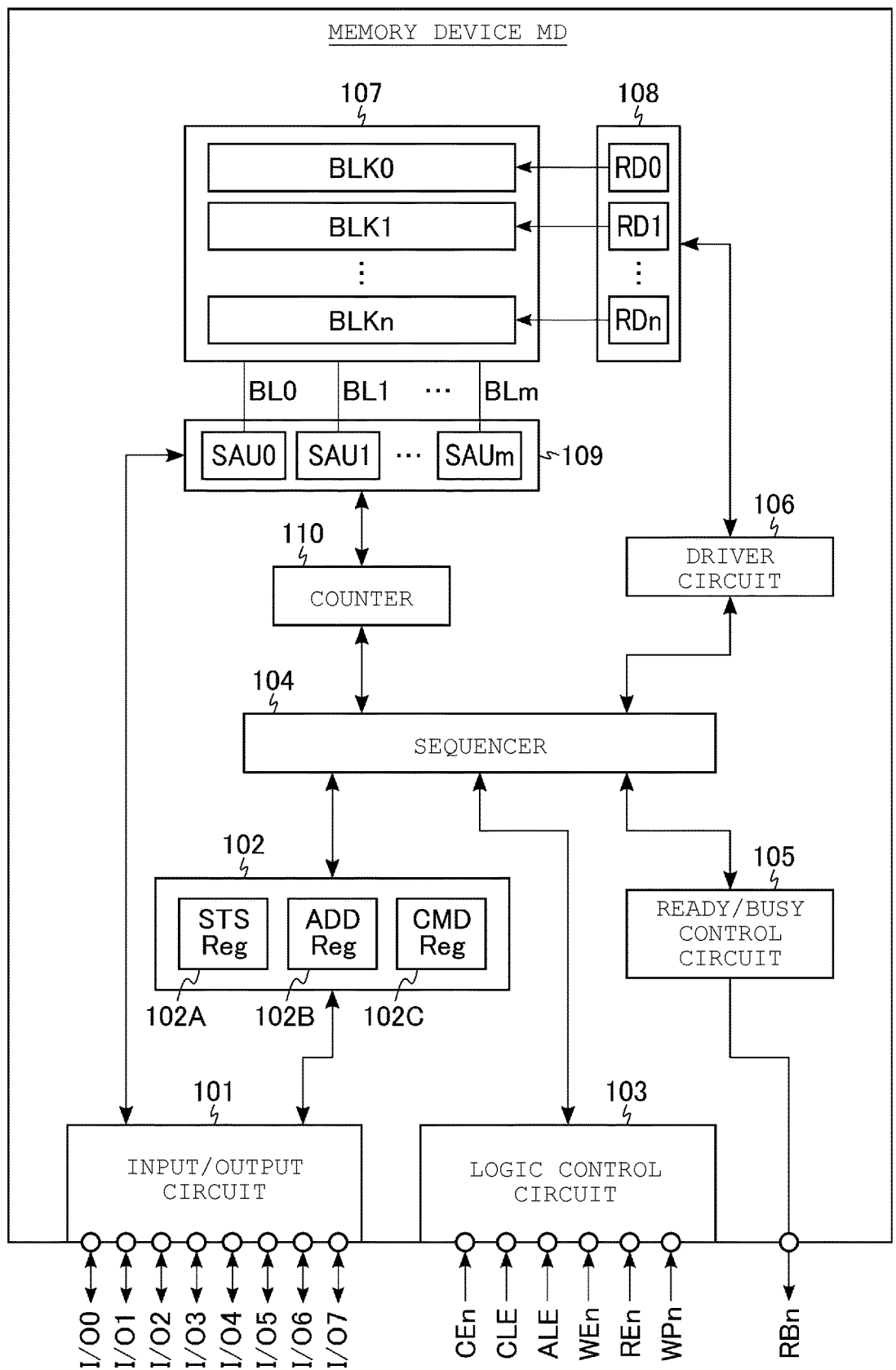
FIG. 2 is a block diagram illustrating an example of a configuration of a memory device according to the first embodiment.

FIG. 2 is a block diagram illustrating an example of the configuration of the memory devices MD according to the first embodiment. As illustrated in FIG. 2, the memory device MD includes, for example, an input/output circuit 101, a register set 102, a logic control circuit 103, a sequencer 104, a ready/busy control circuit 105, a driver circuit 106, a memory cell array 107, a row decoder module 108, a sense amplifier module 109, and a counter 110.

The input/output circuit 101 transmits and receives, for example, 8-bit wide input/output signals I/O0 to I/O7 to and from the memory controller 20. The input/output signal I/O may include data, status information, address information, command, and the like. The input/output circuit 101 transmits and receives data DAT to and from the sense amplifier module 109.

The register set 102 includes a status register (STS Reg) 102A, an address register (ADD Reg) 102B, and a command register (CMD Reg) 102C. The status register 102A, the address register 102B, and the command register 102C latch status information STS, address information ADD, and the command CMD, respectively. The status information STS is transferred from the status register 102A to the input/output circuit 101 based on the instruction from the memory controller 20 and is output to the memory controller 20. The address information ADD is transferred from the input/output circuit 101 to the address register 102B and may include a block address, a page address, a column address, and the like. The command CMD is transferred from the input/output circuit 101 to the command register 102C and includes an instruction relating to various operations of the memory devices MD.

The logic control circuit 103 controls the input/output circuit 101 and the sequencer 104 based on the control signal received from the memory controller 20. As the control signal, for example, a chip enable signal CEn, a command latch enable signal CLE, an address latch enable signal ALE, a write enable signal WEn, a read enable signal REn, and a write protect signal WPn are used. The chip enable signal CEn is a signal that enables the memory device MD. The command latch enable signal CLE is a signal for notifying the input/output circuit 101 that the received input/output signal I/O is the command CMD. The address latch enable signal ALE is a signal for notifying the input/output circuit 101 that the received input/output signal I/O is the address information ADD. The write enable signal WEn is a signal that instructs the input/output circuit 101 to input the input/output signal I/O. The read enable signal REn is a signal for instructing the input/output circuit 101 to output the input/output signal I/O. The write protect signal WPn is a signal for causing the memory device MD to enter a protection state when the power is turned on and off.

The sequencer 104 controls the operation of the entire memory devices MD. For example, the sequencer 104 performs the read operation, the write operation, the erasing operation, and the like based on the command CMD latched in the command register 102C and the address information ADD latched in the address register 102B. The sequencer 104 updates the status information STS in the status register 102A based on the operation and the state of the memory device MD.

The ready/busy control circuit 105 generates a ready/busy signal RBn based on the operation state of the sequencer 104. The ready/busy signal RBn is a signal for notifying the memory controller 20 that the memory device MD is in the ready state or the busy state. In the present specification, the "ready state" indicates that a state in which the memory device MD receives the instruction from the memory controller 20, and the "busy state" indicates a state in which the memory device MD does not receive the instruction from the memory controller 20.

The driver circuit 106 generates the voltage used for the read operation, the write operation, the erasing operation, and the like. Also, the driver circuit 106 supplies the generated voltage to the memory cell array 107, the row decoder module 108, and the sense amplifier module 109.

The memory cell array 107 includes a plurality of blocks BLK0 to BLKn (n is an integer of 1 or more). The block BLK is a set of a plurality of memory cell transistors that can store data in a non-volatile manner. The block BLK is used, for example, as an erasing unit of the data. A plurality of bit lines BL0 to BLm (m is an integer of 1 or more), a plurality of word lines, and a source line are provided in the memory cell array 107. Each memory cell transistor is associated with one bit line BL and one word line.

The row decoder module 108 selects the block BLK to be operated based on the block address. Also, the row decoder module 108 transfers a voltage supplied from the driver circuit 106 to various wirings in the selected block BLK. The row decoder module 108 includes a plurality of row decoders RD0 to RDn. The row decoders RD0 to RDn are associated with the blocks BLK0 to BLKn, respectively.

During the read operation, the sense amplifier module 109 reads data from the memory cell array 107 and transfers the read data to the input/output circuit 101. During the write operation, the sense amplifier module 109 applies the desired voltage to the bit line BL based on the data received from the input/output circuit 101. For example, the sense amplifier module 109 includes a plurality of sense amplifier units SAU0 to SAUm. The sense amplifier units SAU0 to SAUm are associated with the bit lines BL0 to BLm, respectively.

For example, the counter 110 counts the number of pieces of data of "1" or the number of pieces of data of "0" transferred from the sense amplifier module 109. Also, the counter 110 transfers the count result to the sequencer 104. For example, the counter 110 is used for determining the verification pass during the write operation.

[1-1-3] Circuit Configuration of Memory Device MD (Circuit Configuration of Memory Cell Array 107)

Figure 3:
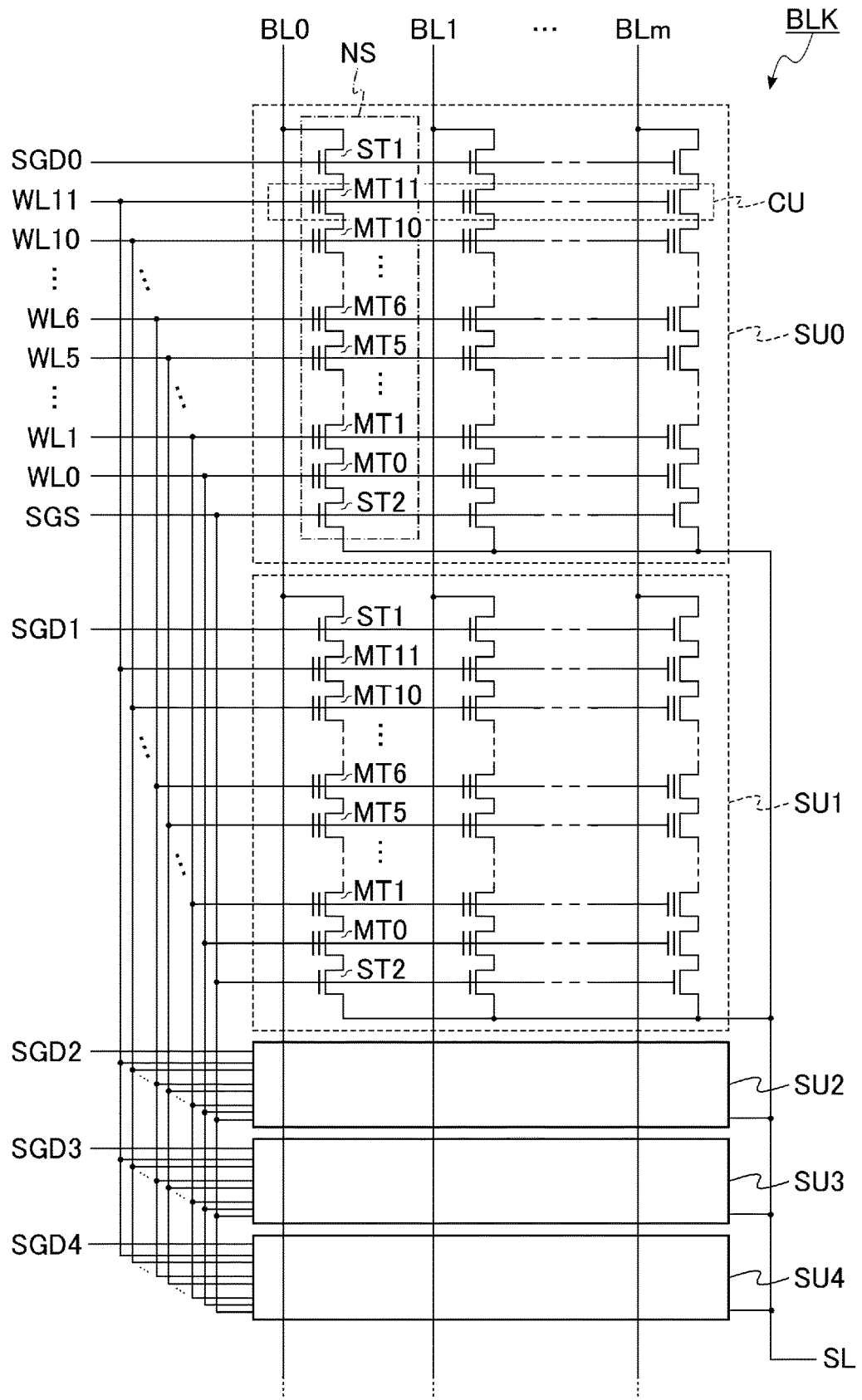
FIG. 3 is a circuit diagram illustrating an example of a circuit configuration of a memory cell array provided in the memory device according to the first embodiment.

FIG. 3 is a circuit diagram illustrating an example of a circuit configuration of the memory cell array 107 provided in the memory device MD according to the first embodiment. In FIG. 3, one block BLK is extracted and illustrated. As illustrated in FIG. 3, the block BLK includes string units SU0 to SU4, word lines WL0 to WL11, selected gate lines SGD0 to SGD4, and a selected gate line SGS. Each string unit SU includes a plurality of NAND strings NS connected to the bit lines BL0 to BLm, respectively. Each NAND string NS includes memory cell transistors MT0 to MT11 and select transistors ST1 and ST2.

Each memory cell transistor MT includes a control gate and a charge storage layer and stores data in a non-volatile manner. The select transistors ST1 and ST2 are used for selecting the string units SU during various operations. Column addresses different from each other are allocated to the bit lines BL0 to BLm, respectively. The bit lines BL are connected to the plurality of NAND strings NS in the plurality of blocks BLK, respectively. For example, a source line SL is shared between the plurality of blocks BLK.

The memory cell transistors MT0 to MT11 of each NAND string NS are connected in series. One ends and the other ends of the memory cell transistors MT0 to MT11 connected in series are connected to the sources of the select transistors ST1 and the drains of the select transistors ST2, respectively. The drains of the select transistors ST1 of the NAND strings NS are connected to the associated bit lines BL. The sources of the select transistors ST1 of the NAND strings NS are connected to the source line SL. The word lines WL0 to WL11 are connected to the memory cell transistors MT0 to MT11 of the NAND strings NS, respectively. The selected gate lines SGD0 to SGD4 are connected to the respective gates of the plurality of select transistors ST1 in the string units SU0 to SU4, respectively. The selected gate line SGS is connected to the gates of the select transistors ST2 of the respective NAND strings NS.

Further, the circuit configuration of the memory cell array 107 may be the other circuit configurations. The number of string units SU in each block BLK and the respective numbers of memory cell transistors MT and select transistors ST1 and ST2 in each NAND string NS may be freely selected. In the present specification, a set of the plurality of memory cell transistors MT connected to the common word line WL in one string unit SU is referred to as a "cell unit CU". When each memory cell transistor MT stores 1-bit data, the cell unit CU stores "1-page data". The cell units CU may include the storage capacity of 2-page data or more according to the number of bits stored in each memory cell transistor MT.

(Circuit Configuration of Row Decoder Module 108)

Figure 4:
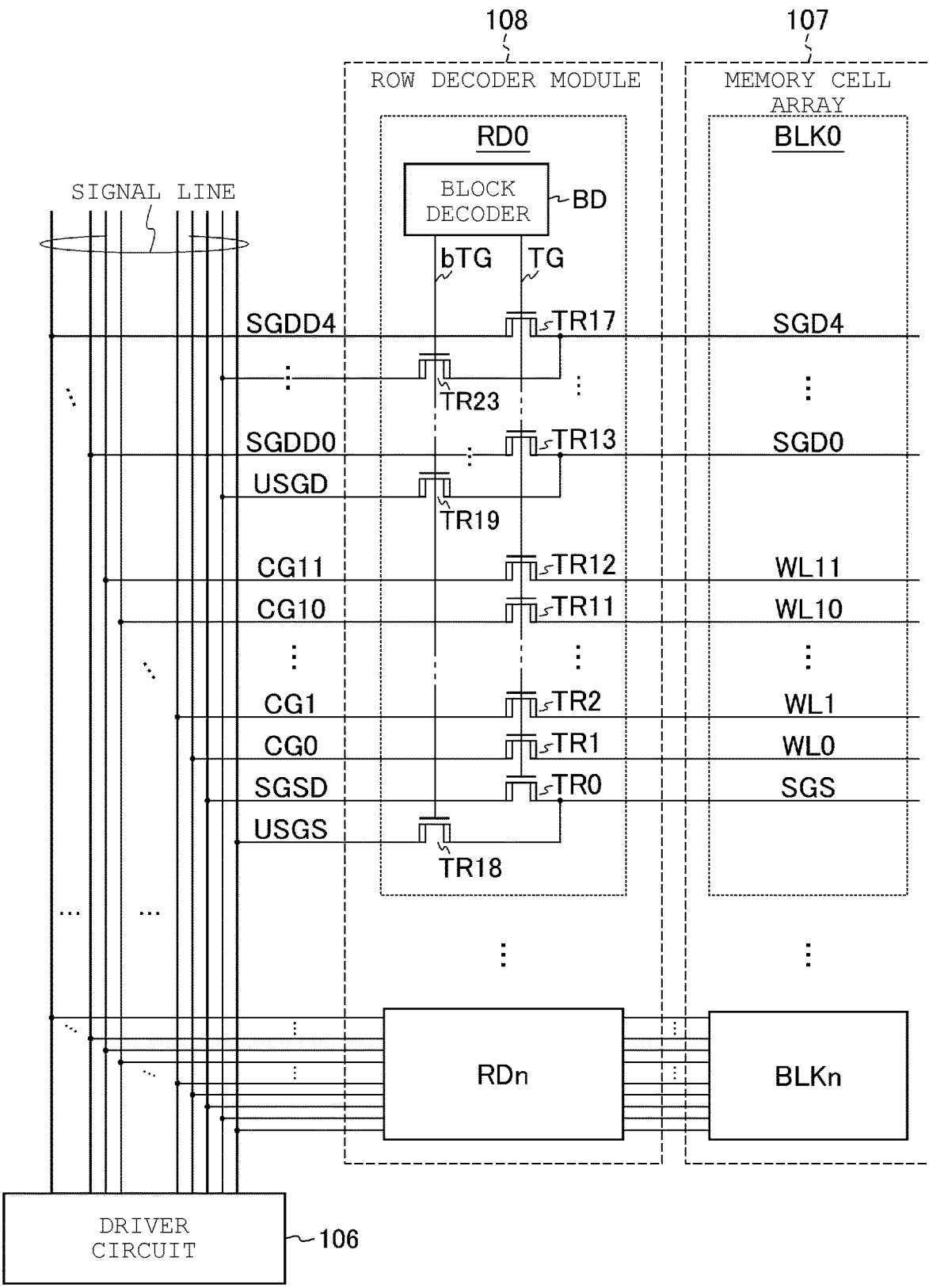
FIG. 4 is a circuit diagram illustrating an example of a circuit configuration of a row decoder module provided in the memory device according to the first embodiment.

FIG. 4 is a circuit diagram illustrating an example of the circuit configuration of the row decoder module 108 provided in the memory device MD according to the first embodiment. FIG. 4 illustrates the connection between the driver circuit 106 and the memory cell array 107 via the row decoder module 108, and the detailed circuit configuration of one row decoder RD0. As illustrated in FIG. 4, the row decoders RD of the row decoder module 108 and the driver circuit 106 are connected to each other via signal lines CG0 to CG11, SGDD0 to SGDD4, SGSD, USGD, and USGS. The blocks BLK associated with the row decoders RD of the row decoder module 108 are connected via the word lines WL0 to WL11 and the selected gate lines SGD0 to SGD4. Each row decoder RD includes transistors TR0 to TR23, the transfer gate lines TG and bTG, and a block decoder BD.

Each of the transistors TR0 to TR23 is a high breakdown voltage N-type MOS transistor. The drain and the source of the transistor TR0 are connected to the signal line SGSD and the selected gate line SGS, respectively. The respective drains of the transistors TR1 to TR12 are connected to the signal lines CG0 to CG11, respectively. The respective sources of the transistors TR1 to TR12 are connected to the word lines WL0 to WL11, respectively. The respective drains of the transistors TR13 to TR17 are connected to the signal lines SGDD0 to SGDD4, respectively. The respective sources of the transistors TR13 to TR17 are connected to the selected gate lines SGD0 to SGD4, respectively. The drain and the source of the transistor TR18 are connected to the signal line USGS and the selected gate line SGS, respectively. The respective drains of the transistors TR19 to TR23 are connected to the signal line USGD. The respective sources of the transistors TR19 to TR23 are connected to the selected gate lines SGD0 to SGD3, respectively. The respective gates of the transistors TR0 to TR17 are connected to the transfer gate line TG. The respective gates of the transistors TR18 to TR23 are connected to the transfer gate line bTG.

The block decoder BD decodes a block address BA and a predetermined voltage is applied to the transfer gate lines TG and bTG based on the decoded result. In other words, the row decoder module 108 selects the block BLK based on the block address BA input to the block decoder BD of each row decoder RD. Specifically, for example, the block decoder BD corresponding to the selected block BLK applies voltages in an "H" level and an "L" level to the transfer gate lines TG and bTG, respectively. The block decoders BD corresponding to the non-selected blocks BLK apply voltages in the "L" level and the "H" level to the transfer gate lines TG and bTG, respectively. Accordingly, the voltages of the signal lines CG0 to CG11 are transferred to the word lines WL0 to WL11 of the selected block BLK, respectively, the voltages of the signal lines SGDD0 to SGDD4 and SGSD are transferred to the selected gate lines SGD0 to SGD4 and SGS of the selected blocks BLK, and the voltages of the signal line USGD and USGS are transferred to the selected gate lines SGD and SGS of the non-selected blocks BLK, respectively.

Further, the row decoder module 108 may have the other circuit configurations. For example, the number of transistors TR provided in the row decoder module 108 may be changed according to the number of wirings provided in each block BLK. The signal lines CG are shared between the plurality of blocks BLK and thus may be referred to as "global word lines". The word lines WL are provided for each block and thus may be referred to as "local word lines". The signal lines SGDD and SGSD are shared between the plurality of blocks BLK and thus may be referred to as "global transfer gate lines". The selected gate lines SGD and SGS are provided for each block, and may be referred to as "local transfer gate lines".

(Circuit Configuration of Sense Amplifier Module 109)

Figure 5:
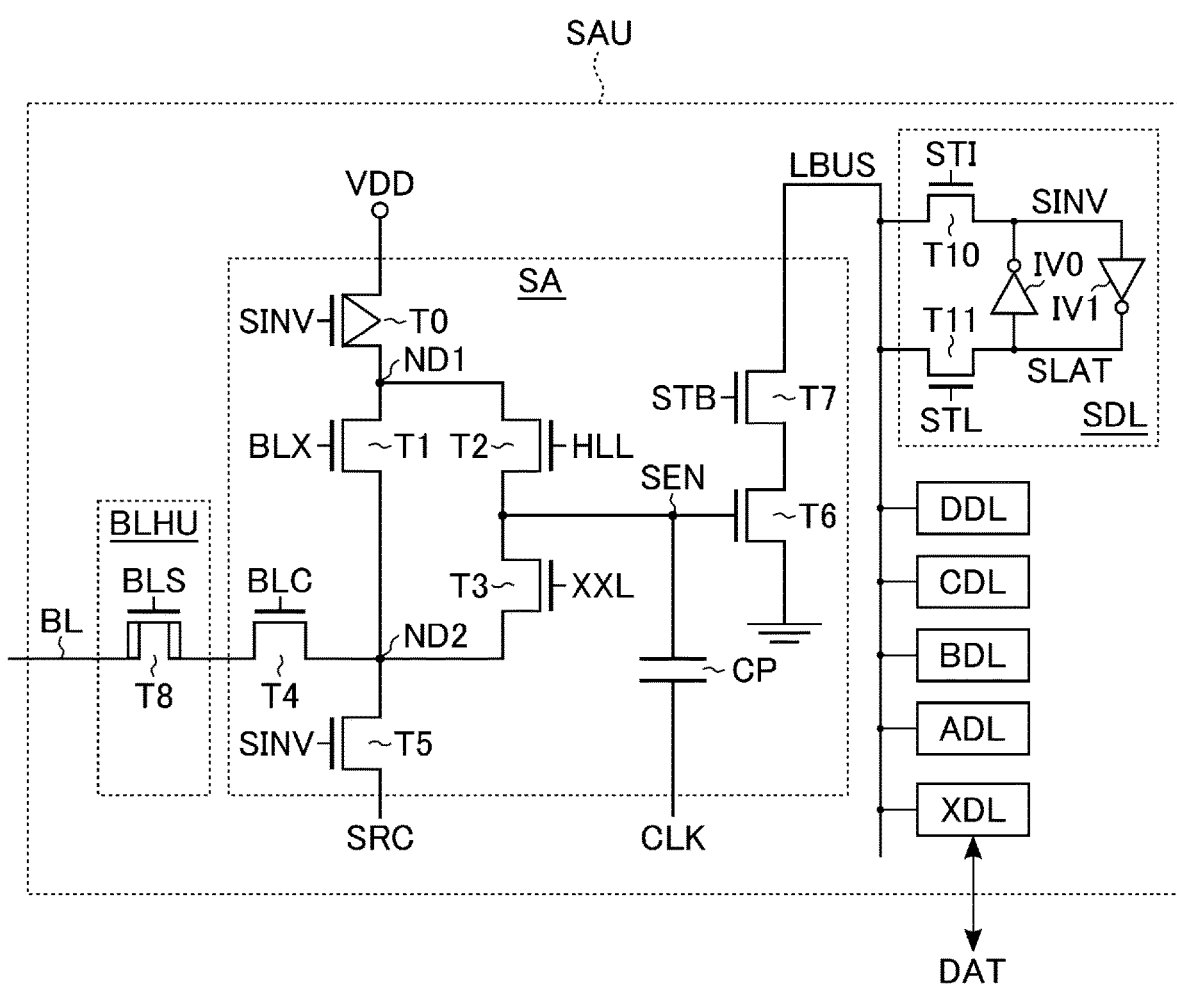
FIG. 5 is a circuit diagram illustrating an example of a circuit configuration of a sense amplifier module provided in the memory device according to the first embodiment.

FIG. 5 is a circuit diagram illustrating an example of the circuit configuration of the sense amplifier module 109 provided in the memory device MD according to the first embodiment. In FIG. 5, one sense amplifier unit SAU is extracted and illustrated. As illustrated in FIG. 5, the sense amplifier unit SAU includes a sense amplifier unit SA, a bit line connection unit BLHU, latch circuits SDL, ADL, BDL, CDL, DDL, and XDL, and a bus LBUS. The sense amplifier unit SA and the latch circuits SDL, ADL, BDL, CDL, DDL, and XDL are configured so that data can be transmitted and received via the bus LBUS.

When a control signal STB is asserted during the read operation, the sense amplifier unit SA determines whether the data read from the selected memory cell transistor MT is "0" or "1" based on the voltage of the associated bit line BL. The latch circuits SDL, ADL, BDL, CDL, and XDL temporarily latch read data, write data, or the like. The latch circuit XDL is used for inputting and outputting data between the sense amplifier unit SAU and the input/output circuit 101. The latch circuit XDL may be used as a cache memory. The memory device MD can enter a ready state at least when the latch circuit XDL is available. The latch circuit XDL can transfer data to the counter 110.

The sense amplifier unit SA includes transistors T0 to T7, a capacitor CP, and nodes ND1, ND2, SEN, and SRC. The bit line connection unit BLHU includes a transistor T8. The latch circuit SDL includes inverters IV0 and IV1, the transistors T10 and T11, and nodes SINV and SLAT. Each circuit configuration of the latch circuits ADL, BDL, CDL, DDL, and XDL is similar to that of the latch circuit SDL. The transistor T0 is a P-type MOS transistor. Each of the transistors T1 to T8, T10, and T11 is an N-type MOS transistor. The transistor T8 is an N-type MOS transistor having a higher breakdown voltage than the N-type transistor in the sense amplifier unit SA.

The node ND1 is connected to the drain of the transistor T0 and the drains of the transistors T1 and T2. The node ND2 is connected to the respective sources of the transistors T1 and T3 and the respective drains of the transistors T4 and T5. The node SEN is connected to the source of the transistor T2, the drain of the transistor T3, the gate of the transistor T6, and one electrode of the capacitor CP. The source of the transistor T0 is connected to the power supply line. The source of the transistor T5 is connected to the node SRC. The source of the transistor T6 is grounded. The drain and the source of the transistor T7 are connected to the bus LBUS and the drain of the transistor T6, respectively. The drain and the source of the transistor T8 are connected to the source of the transistor T4 and the associated bit line BL, respectively. Respective one ends of the transistors T10 and T11 are connected to the bus LBUS. The node SINV is connected to the other end of the transistor T10, the output node of the inverter IV0, the input node of the inverter IV1, and the respective gates of the transistors T0 and T5. The node SLAT is connected to the other end of the transistor T11, the input node of the inverter IV0, and the output node of the inverter IV1.

For example, a power supply voltage VDD is applied to the source of the transistor T0. For example, a ground voltage VSS is applied to the node SRC. The control signals BLX, HLL, XXL, BLC, and STB are input to the respective gates of the transistors T1, T2, T3, T4, and T7. The control signal BLS is input to the gate of the transistor T8. Control signals STI and STL are input to the respective gates of the transistors T10 and T11, respectively. A clock signal CLK is input to the other electrode of the capacitor CP. Each of the control signals BLX, HLL, XXL, BLC, STB, BLS, STI, and STL, and the clock signal CLK is generated, for example, by the sequencer 104. The node SLAT of the latch circuit SDL is used for latching data. The node SINV of the latch circuit SDL is used to latch inverted data of the node SLAT. The sequencer 104 can control the connection with the bus LBUS for each latch circuit by independently controlling the transistors T10 and T11 of each latch circuit.

Further, the sense amplifier module 109 may have the other circuit configurations. The number of latch circuits provided in each sense amplifier unit SAU may be five or less or seven or more. The sense amplifier unit SAU may have an arithmetic circuit that can perform a simple logical operation. In the present example, the asserting of the control signal corresponds to the temporary change of the voltage in the "L" level to the voltage in the "H" level. When the transistor T6 is the P-type transistor, the asserting of the control signal STB corresponds to the temporary change of the voltage in the "H" level to the voltage in the "L" level.

[1-1-4] Structure of Memory Device MD

Hereinafter, an example of the structure of the memory device MD is described. In the drawing referred to below, an X direction corresponds to the stretching direction of the word line WL, a Y direction corresponds to the stretching direction of the bit line BL, and a Z direction corresponds to a direction vertical to the front surface of the semiconductor substrate used to form the memory device MD. Hatching is appropriately added to the plan view for easier understanding of the figure. Hatching added to the plan view is not necessarily related to the materials and properties of the associated components. In the cross-sectional view, the illustration of the configuration is appropriately omitted for easier understanding of the figure.

(Planar Layout of Memory Cell Array 107)

Figure 6:
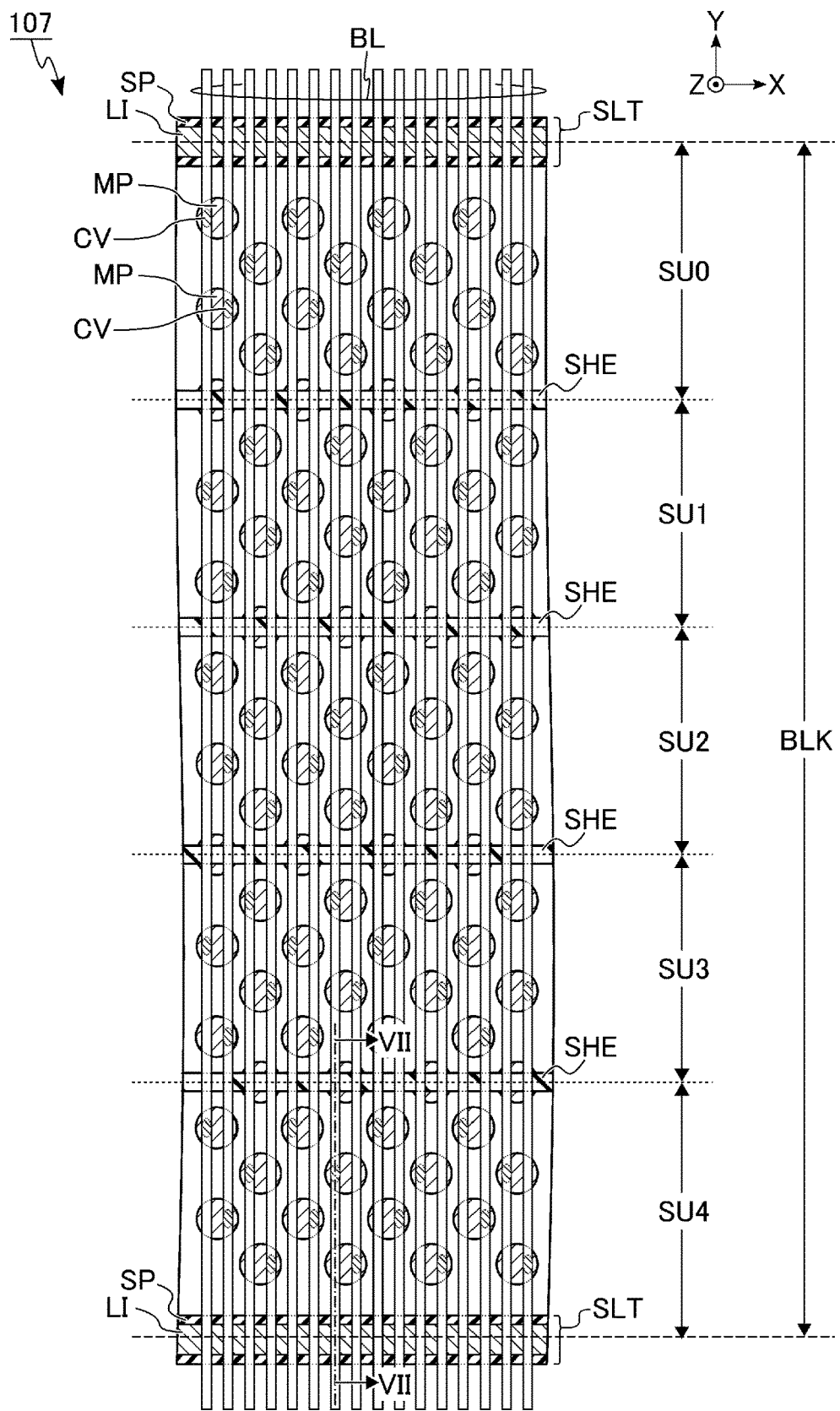
FIG. 6 is a plan view illustrating an example of a planar layout of the memory cell array provided in the memory device according to the first embodiment.

FIG. 6 is a plan view illustrating an example of the planar layout of the memory cell array 107 provided in the memory device MD according to the first embodiment. As illustrated in FIG. 6, the memory cell array 107 includes a plurality of slits SLT, a plurality of slits SHE, a plurality of memory pillars MP, the plurality of bit lines BL, and a plurality of contacts CV.

Each slit SLT has a portion provided in a manner of stretching along the X direction. The plurality of slits SLT are arranged in the Y direction. In the memory cell array 107, each region separated by the slits SLT corresponds to one block BLK. Each slit SLT divides wirings (for example, the word lines WL0 to WL11 and the selected gate lines SGD and SGS) adjacent to each other via the corresponding slit SLT. Each slit SLT includes a contact LC and a spacer SP. A contact LI is a conductor having a portion provided in a manner of stretching along the X direction. The contact LI is used as a part of the source line SL. The spacer SP is an insulator provided on the side surface of the contact LI. The contact LI is sandwiched in the Y direction by the set of the spacers SP. The contact LI and the conductor adjacent to the corresponding contact LI in the Y direction are separated and insulated by the spacer SP.

Each slit SHE has a portion provided in a manner of stretching along the X direction. The plurality of slits SHE are arranged in the Y direction. In the memory cell array 107, respective regions separated by the slits SLT and SHE correspond to one string unit SU. In the present example, four slits SHE are disposed between the adjacent slits SLT, and five string units SU are provided in each block BLK. Each slit SHE has a structure, for example, in which an insulator is embedded. Each slit SHE divides wiring (at least the selected gate lines SGD) adjacent to each other via the corresponding slit SHE.

For example, each memory pillar MP functions as one NAND string NS. The plurality of memory pillars MP are arranged in a staggered pattern of 24 columns in a region between two adjacent slits SLT. Also, in the present example, being counted from the upper side of the paper, one slit SHE overlaps with each of the memory pillar MP in the fifth column, the memory pillar MP in the tenth column, the memory pillar MP in the fifteenth column, and the memory pillar MP in the twentieth column.

Each bit line BL has a portion provided in a manner of stretching in the Y direction. The plurality of bit lines are arranged in the X direction. Each bit line BL overlaps with at least one memory pillar MP for each string unit SU. In the present example, two bit lines BL overlap with each memory pillar MP. The contact CV is disposed between one bit line BL among the plurality of bit lines BL overlapping with the memory pillar MP and the corresponding memory pillar MP. Each memory pillar MP is electrically connected to the corresponding bit line BL via the associated contact CV. In the present example, the contact CV between the memory pillar MP that is in contact with the slit SHE and the bit line BL is omitted.

In the memory cell array 107, the layout described above is repeatedly arranged in the Y direction. Further, the planar layout of the memory cell array 107 may have the other layouts. For example, the numbers and the arrangements of the memory pillars MP, the slits SHE, and the like disposed between the adjacent slits SLT may be appropriately changed. The number of string units SU formed between the adjacent slits SLT may be changed based on the number of slits SHE disposed between the adjacent slits SLT. The number of bit lines BL overlapping with each memory pillar MP may be one or three or more.

(Cross-Sectional Structure of Memory Cell Array 107)

Figure 7:
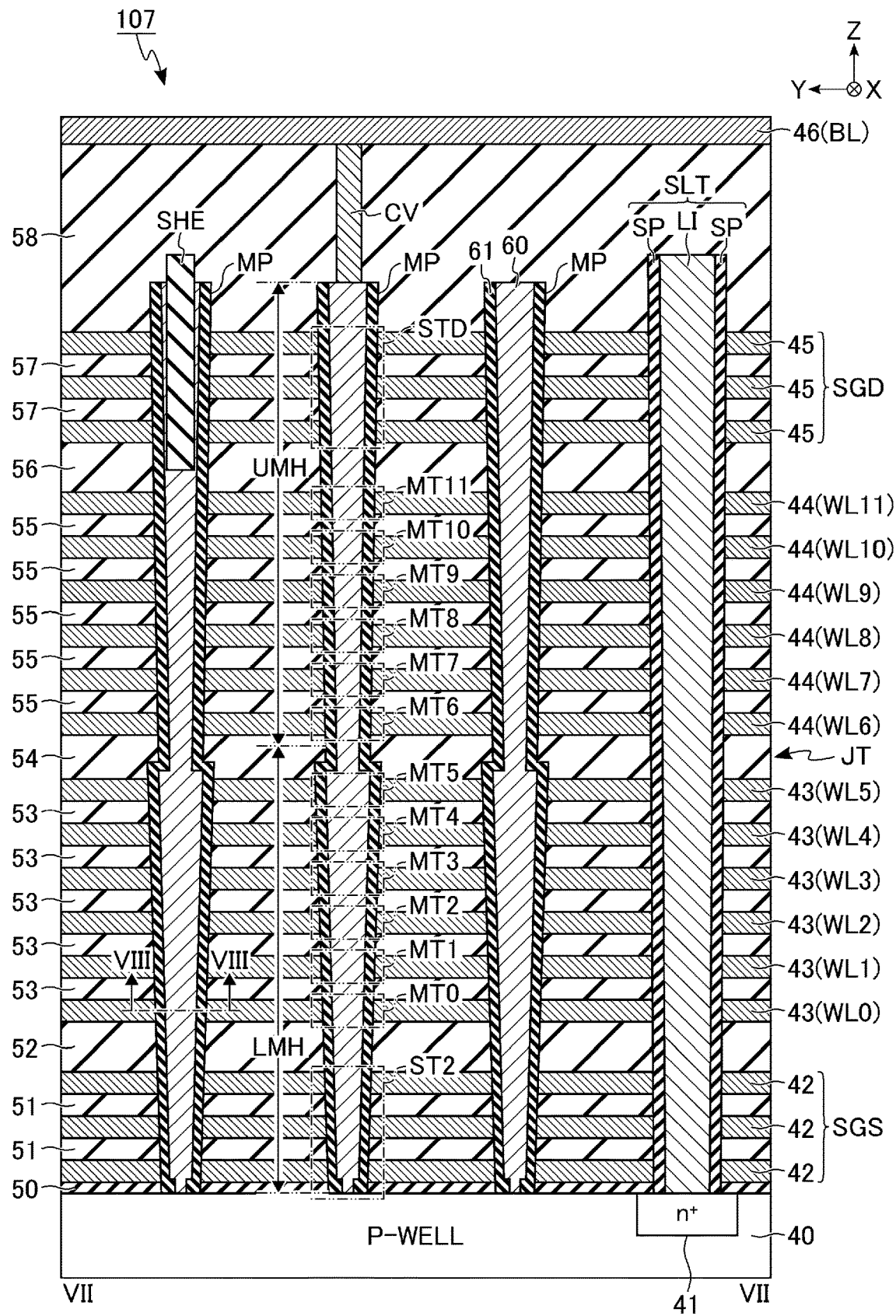
FIG. 7 is a cross-sectional view illustrating an example of a cross-sectional structure of the memory cell array provided in the memory device according to the first embodiment, which is taken along the line VII-VII of FIG. 6.

FIG. 7 is a cross-sectional view illustrating an example of a cross-sectional structure of the memory cell array 107 provided in the memory device MD according to the first embodiment, which is taken along the line VII-VII of FIG. 6. As illustrated in FIG. 7, the memory cell array 107 includes, for example, a P-type well region 40, an N-type semiconductor region 41, conductor layers 42 to 46, insulator layers 50 to 58, the memory pillars MP, the contacts CV, and the slits SLT and SHE.

The P-type well region 40 is provided near the front surface of the semiconductor substrate. The P-type well region 40 is a P-type impurity diffusion region. The N-type semiconductor region 41 is provided near the front surface of the P-type well region 40. The N-type semiconductor region 41 is an N-type impurity diffusion region. The N-type semiconductor region 41 is formed, for example, by doping the P-type well region 40 with phosphorus.

The insulator layer 50 is provided on the P-type well region 40. The conductor layers 42 and the insulator layers 51 are alternately stacked on the insulator layer 50. The insulator layer 52 is provided on the conductor layer 42 of the uppermost layer. The conductor layers 43 and the insulator layers 53 are alternately stacked on the insulator layer 52. The insulator layer 54 is provided on the conductor layer 43 of the uppermost layer. The conductor layers 44 and the insulator layers 55 are alternately stacked on the insulator layer 54. The insulator layer 56 is provided on the conductor layer 44 of the uppermost layer. The conductor layers 45 and the insulator layer 57 are alternately stacked on the insulator layer 56. The insulator layer 58 is provided on the conductor layer 45 of the uppermost layer. The conductor layer 46 is provided on the insulator layer 58.

Each of the conductor layers 42, 43, 44, and 45 are formed, for example, in a plate shape expanding along the XY plane. The conductor layer 46 is formed, for example, in a line shape stretching in the Y direction. The plurality of stacked conductor layers 42 are used as the selected gate line SGS. The plurality of stacked conductor layers 43 are used as the word lines WL0 to WL5, respectively, in an order from the lower layer side. The plurality of stacked conductor layers 44 are used as the word lines WL6 to WL11, respectively, in an order from the lower layer side. The plurality of stacked conductor layers 45 are used as the selected gate lines SGD. The conductor layer 46 is used as the bit line BL. That is, in a region that is not illustrated, the plurality of conductor layers 46 are arranged in the X direction. Each of the conductor layers 42, 43, 44, and 45 includes, for example, tungsten. The conductor layer 46 includes, for example, copper.

The memory pillar MP stretches along the Z direction and penetrates the conductor layers 42 to 45. Each memory pillar MP includes a first portion formed in a hole LMH of the lower layer and a second portion formed in a hole UMH of the upper layer. The first portion penetrates the conductor layers 42 and 43, and the bottom portion is in contact with the P-type well region 40. The second portion is provided above the first portion and penetrates the conductor layers 44 and 45. The memory pillar MP has a step between the first portion and the second portion (boundary portion). In the present specification, a layer including the boundary portion between the first portion and second portion of the memory pillar MP, that is, a layer provided with the insulator layer 54 is also referred to as a "joint layer JT". The memory pillar MP may have a structure in which the outer diameter in the joint layer JT increases. The thickness of the insulator layer 54 is thicker than the respective thicknesses of the insulator layers 53 and 55. In other words, the distance between the conductor layer 43 of the uppermost layer and the conductor layer 44 of the lowermost layer is wider than each of the distance between the adjacent conductor layers 43 and the distance between the adjacent conductor layers 44.

Each memory pillar MP includes a semiconductor layer 60 and a stacked film 61. The semiconductor layer 60 and the stacked film 61 are continuously provided in the first portion and the second portion of the memory pillar MP. The semiconductor layer 60 is provided in a manner of stretching along the Z direction. The upper end of the semiconductor layer 60 is provided in a layer above the conductor layer 45 of the uppermost layer. The lower end of the semiconductor layer 60 is in contact with the P-type well region 40. The stacked film 61 covers the side surface of the semiconductor layer 60. The portions where the memory pillars MP and the plurality of conductor layers 42 intersect with each other function as the select transistors ST2. The portions where the memory pillars MP and one conductor layer 43 intersect with each other and the portions where the memory pillars MP and one conductor layer 44 intersect with each other function as the memory cell transistors MT, respectively. The portions where the memory pillars MP and the plurality of conductor layers 45 intersect with each other function as the select transistors ST1. The detailed cross-sectional structure of the memory pillar MP is described below.

The contacts CV in the columnar shape are provided on the semiconductor layers 60 in each memory pillar MP. One conductor layer 46, that is, one the bit line BL is in contact with the top of the contacts CV. As described above, one contact CV is connected to one conductor layer 46 for each space separated by the slits SLT and SHE.

The slit SLT divides the conductor layers 42 to 45 and the insulator layers 50 to 57. The position at the upper end of the slit SLT is provided in the level where the insulator layer 58 is provided. The lower end of the slit SLT is in contact with the N-type semiconductor region 41. The bottom portion of the contact LI is electrically connected to the N-type semiconductor region 41. The contact LI and the conductor layers 42 to 45 are separated and insulated by the spacer SP.

The slit SHE divides the plurality of conductor layers 45. The position of the upper end of the slits SHE is provided in the level where the insulator layer 58 is provided. The position of the lower end of the slit SHE is included, for example, in the level where the insulator layer 56 is provided. Further, the slit SHE may divide one or more conductor layers 44.

Further, the cross-sectional structure of the memory cell array 107 may have the other structure. For example, memory pillar MP may be formed on the conductor layer that functions as the source line SL. The memory cell array 107 may be provided above the semiconductor substrate, and a peripheral circuit such as the sense amplifier module 109 may be provided below the memory cell array 107. The memory pillar MP may have a structure formed by using three or more connected holes and may have a structure formed by using one hole. The numbers of respective layers of the conductor layers 42 to 45 may be appropriately changed according to the number of wirings provided in the memory cell array 107.

(Cross-Sectional Structure of Memory Pillar MP)

Figure 8:
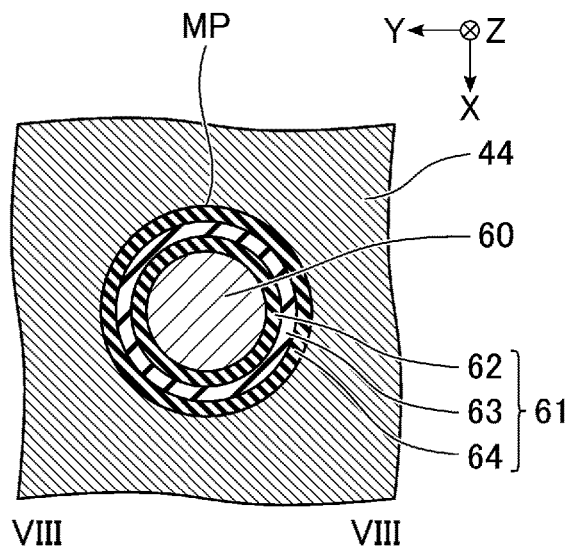
FIG. 8 is a cross-sectional view illustrating an example of a cross-sectional structure of a memory cell pillar provided in the memory device according to the first embodiment, which is taken along the line VIII-VIII of FIG. 7.

FIG. 8 is a cross-sectional view illustrating an example of the cross-sectional structure of the memory pillar MP provided in the memory device MD according to the first embodiment, which is taken along the line VIII-VIII of FIG. 7. As illustrated in FIG. 8, the stacked film 61 includes, for example, a tunnel insulating film 62, an insulating film 63, and a block insulating film 64. In the cross section including the conductor layer 44, the semiconductor layer 60 is provided in the central portion of the memory pillar MP. The side surface of the semiconductor layer 60 is surrounded by the tunnel insulating film 62. The side surface of the tunnel insulating film 62 is surrounded by the insulating film 63. The side surface of the insulating film 63 is surrounded by the block insulating film 64. The side surface of the block insulating film 64 is surrounded by the conductor layer 44.

Each of the tunnel insulating film 62 and the block insulating film 64 includes, for example, silicon oxide. The insulating film 63 includes, for example, silicon nitride. The semiconductor layer 60 functions as a channel (current path) of the memory cell transistors MT0 to MT11 and the select transistors ST1 and ST2. The insulating film 63 is used as the charge storage layer of the memory cell transistor MT. The memory device MD can flow the current between the bit line BL and the contact LI (the source line SL) via the memory pillar MP by turning on the memory cell transistors MT0 to MT11 and the select transistors ST1 and ST2. Further, the cross-sectional structure of the memory pillar MP may have the other structure. For example, an insulator or a void of which the side surface is surrounded by the semiconductor layer 60 may be provided in the central portion of the memory pillar MP.

[1-1-5] Data Storage Method

Figure 9:
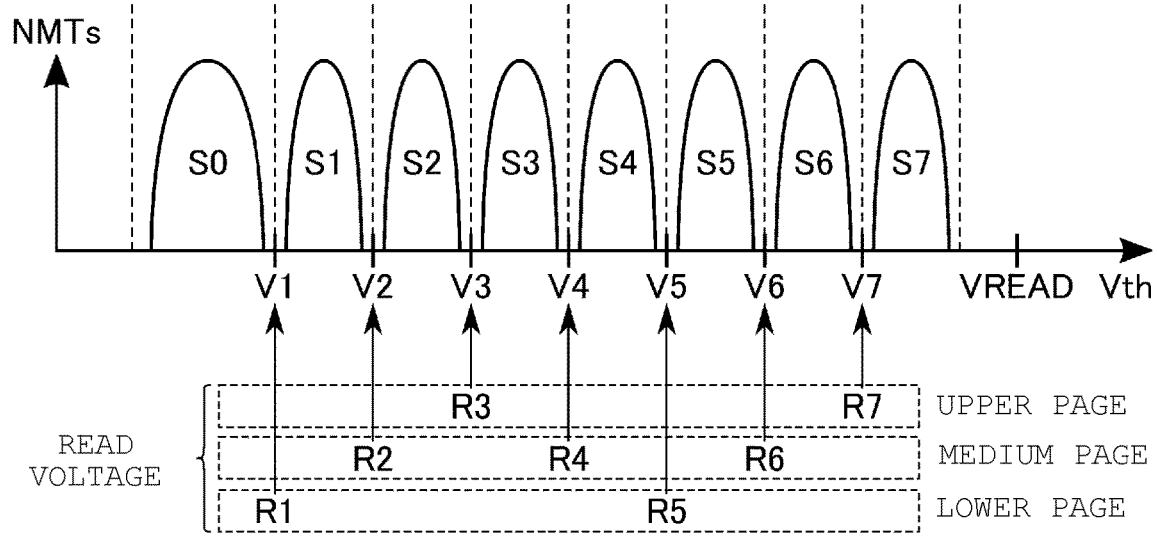
FIG. 9 is a schematic diagram illustrating examples of threshold voltage distribution and data allocation of the memory cell transistor in the memory system according to the first embodiment.

FIG. 9 is a schematic diagram illustrating examples of the threshold voltage distribution and the data allocation of the memory cell transistor MT in the memory system 1 according to the first embodiment. "NMTs" on the vertical axis indicates the number of memory cell transistors MT. "Vth" on the horizontal axis indicates the threshold voltage of the memory cell transistor MT. Hereinafter, the examples of the threshold voltage distribution and the data allocation of the memory cell transistor MT are described with reference to FIG. 9.

When each of the memory cell transistors MT stores 3-bit data, eight states are formed by the threshold voltages of the plurality of memory cell transistors MT. In the present specification, the eight states are respectively referred to as an "S0" state, an "S1" state, an "S2" state, an "S3" state, an "S4" state, an "S5" state, an "S6" state, and an "S7" state in an ascending order of the threshold voltage, and 3-bit data that is different from each other is allocated to the "S0" to "S7" states, respectively. In other words, 3-bit data that is different from each other is allocated to the plurality of states that are set according to the height of threshold voltage of the memory cell transistor MT, respectively. Hereinafter, an example of the allocation of the data with respect to the eight states is provided:

"S0" state: Data of "111 (upper bit/medium bit/lower bit)",
"S1" state: Data of "110",
"S2" state: Data of "100",
"S3" state: Data of "000",
"S4" state: Data of "010",
"S5" state: Data of "011",
"S6" state: Data of "001", and
"S7" state: Data of "101".

The read voltage and the verification voltage are set between adjacent states. Specifically, a read voltage R1 is set between the "S0" and "S1" states. A read voltage R2 is set between the "S1" and "S2" states. A read voltage R3 is set between the "S2" and "S3" states. A read voltage R4 is set between the "S3" and "S4" states. A read voltage R5 is set between the "S4" and "S5" states. A read voltage R6 is set between the "S5" and "S6" states. A read voltage R7 is set between the "S6" and "S7" states. During the verification operation, verification voltages V1 to V7 are used for verification reading of the "S1" to "S7" states, respectively. The verification voltages V1 to V7 may be the same as or different from the read voltages R1 to R7, respectively. A read pass voltage VREAD can be set to a voltage higher than that in the state "S7" with the highest threshold voltage. The memory cell transistor MT in which the read pass voltage VREAD is applied to the gate enters an ON state regardless of the stored data.

When such data allocation is applied, 1-page data (lower page data) configured with lower bits is confirm by the read operation using the read voltages R1 and R5. The 1-page data (medium page data) configured with medium bits is confirmed by the read operation using the read voltages R2, R4, and R6. The 1-page data (upper page data) configured with upper bits is confirmed by the read operation using the read voltages R3 and R7. In the read operation of the page using the plurality of read voltages, an arithmetic process is appropriately performed in the sense amplifier units SAU. Further, as a 3-bit data storage method, the other data allocation may be used. In each memory cell transistor MT, data of 1 bit, 2 bits, or 4 or more bits may be stored.

[1-2] Operation

Subsequently, the operation of the memory system 1 according to the first embodiment is described. In the following, the selected word line WL is referred to as "WLsel". Applying a voltage to the word line WL corresponds to the driver circuit 106 applying a voltage to the corresponding word line WL via the row decoder module 108. The address information ADD and the command CMD received by the memory device MD are transferred to the address register 102B and the command register 102C, respectively. The write data received by the memory device MD is transferred to the latch circuit XDL in each sense amplifier unit SAU in the sense amplifier module 109.

[1-2-1] Outline of Write Operation (Flow of Write Operation)

FIG. 10 is a flowchart illustrating an example of the write operation of the memory system 1 according to the first embodiment. Hereinafter, the flow of the write operation of the memory system 1 is described with reference to FIG. 10.

When the host device 30 transmits the write data to the memory system 1, the memory controller 20 starts a series of processes of FIG. 10 (START).

First, the memory controller 20 receives the write data from the host device 30 (Step S100). The write data received by the memory controller 20 is, for example, stored in the RAM 23.

Subsequently, the memory controller 20 determines the write destination of the write data (Step S101). For example, for the determination of the write destination, the management table of the storage region loaded into the RAM 23 is referred to.

Subsequently, the memory controller 20 causes the memory device MD to perform the write operation (Step S102). Specifically, the memory controller 20 transmits a command of instructing the write operation or write data to the memory device MD, and the memory device MD that receives the command or the write data performs the write operation.

When the write operation of the memory device MD is completed, the memory controller 20 reads the status information STS from the memory device MD and checks whether the status of the write operation is a pass (Step S103). That is, the memory controller 20 determines whether the writing of the data succeeds based on the status information STS. In the following, the operation of reading the status information STS from the memory device MD by the memory controller 20 is also referred to as "status reading".

When the status pass is not verified in the process of Step S103 (NO in Step S103), that is, when the status fail is verified, the memory controller 20 registers the block BLK to which the writing of the data is failed as a defective block (Step S104). Also, the memory controller 20 proceeds to the process of Step S101. That is, the memory controller 20 changes the write destination and retries the write operation.

When the status pass is verified in the process of Step S103 (YES in Step S103), the memory controller 20 updates the look-up table LUT based on the address in which the writing of the data succeeds (Step S105).

After the process of Step S105, the memory controller 20 discards the write data stored in the RAM 23 and ends the series of processes of FIG. 10 (END).

(Command Sequence of Write Operation)

FIG. 11 is a schematic diagram illustrating an example of the command sequence in the write operation of the memory system 1 according to the first embodiment. FIG. 11 illustrates the exchange of the input/output signal I/O between the memory controller 20 and the memory device MD and the change of the ready/busy state. Hereinafter, the command sequence of the write operation is described with reference to FIG. 11.

First, as illustrated in (1) of FIG. 11, the memory controller 20 transfers the command set including data of the first page (lower page data in a TLC mode) in the 3-page data allocated to the cell unit CU of the write destination to the memory device MD. Specifically, the memory controller 20 transmits a command "01h", a command "80h", address information "ADD", write data "Din" of a lower page, a command "1Ah" to the memory device MD in this order. The command "01h" is a command that instructs the operation corresponding to the data of the first page. The command "80h" is a command of instructing the write operation. The address information "ADD" includes an address allocated to the cell unit CU of the write destination. The command "1Ah" is a command of instructing the transfer of the data latched in the latch circuit XDL to the other latch circuit. When the command "1Ah" is received, the memory device MD temporarily transitions to the busy state, and transfers the lower page data from the latch circuit XDL to, for example, the latch circuit ADL.

Subsequently, as illustrated in (2) of FIG. 11, the memory controller 20 transfers the command set including the data of the second page (the medium page data in the TLC mode) in the 3-page data allocated to the cell unit CU of the write destination to the memory device MD. Specifically, the memory controller 20 transmits a command "02h", the command "80h", the address information "ADD", the write data "Din" of the medium page, the command "1Ah" to the memory device MD in this order. The command "02h" is a command of instructing the operation corresponding to the data of the second page. When the command "1Ah" is received, the memory device MD temporarily transitions to the busy state and transfers the medium page data from the latch circuit XDL to, for example, the latch circuit BDL.

Subsequently, as illustrated in (3) of FIG. 11, the memory controller 20 transfers a command set including the data of the third page (upper page data in the TLC mode) in the 3-page data allocated to the cell unit CU of the write destination to the memory device MD. Specifically, the memory controller 20 transmits a command "03h", the command "80h", the address information ADD", the write data "Din" of the upper page, a command "10h" to the memory device MD in this order. The command "03h" is a command of instructing the operation corresponding to the data of the third page. For example, the command "10h" is a command of instructing the start of the write operation after the upper page data stored in the latch circuit XDL is transferred to the latch circuit CDL.

When the command "10h" is received, the memory device MD transitions from the ready state (RBn=the "H" level) to the busy state (RBn=the "L" level) as illustrated in (4) of FIG. 11. Then, the memory device MD performs the write operation, for example, by using the 3-bit data stored in the latch circuits ADL, BDL, and CDL. When the write operation is completed, the memory device MD transitions from the busy state to the ready state and notifies the completion of the write operation to the memory controller 20. The illustrated "tProg" corresponds to the time when the memory device MD performs the write operation.

When the write operation is completed, the memory device MD transitions from the busy state to the ready state, the memory controller 20 performs the first status reading as illustrated in (5) of FIG. 11. Specifically, the memory controller 20 transmits a command "70h" to the memory device MD. The memory device MD that receives the command "70h" transmits status information "Sout" stored in the status register 102A to the memory controller 20. The status information "Sout" includes the status information STS of the write operation performed immediately before. Also, the memory controller 20 checks the status of the write operation with reference to the status information "Sout" (Step S103 of FIG. 10).

FIG. 12 is a table showing an example of the status information STS (Sout) output from the memory device MD in the write operation of the memory system 1 according to the first embodiment. As illustrated in FIG. 12, the status information STS output by the first status reading includes data indicating the write result. The data indicating the write result is transmitted, for example, via I/O0. For example, the data of "0" stored in I/O0 of the status information STS shows that the write operation is normally completed. When the data of "1" stored in I/O0 of the status information STS indicates that the write operation is not normally completed, for example, the writing is not completed by the program loop in a predetermined number of times. Further, each piece of data included in the status information may be referred to as "status data".

The status information STS may include, for example, data indicating whether the memory device MD is in the course of the operation (True busyn), data indicating whether the cache is available (Cache busyn), and the write protect signal WPn. For example, True busyn, Cache busyn, and WPn are transmitted via I/O5, I/O6, and I/O7, respectively. The status information STS read after the write operation may include at least data indicating the write result. Further, in the allocation to the input/output signal I/O of the status information STS in the first status reading may be the other allocation.

[1-2-2] Operation of Memory Device MD (Flow of Write Operation by Memory Device MD)

Figure 13:
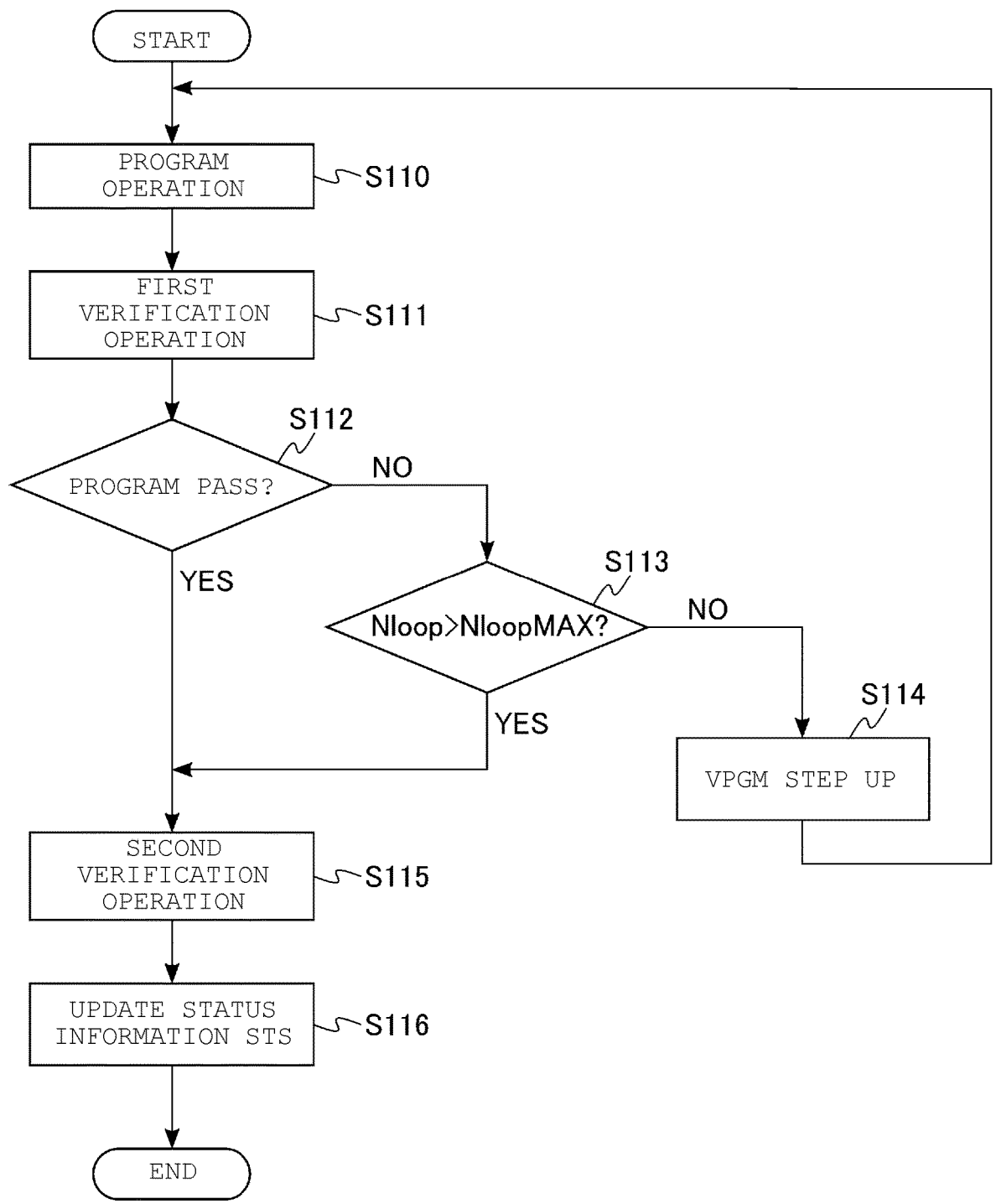
FIG. 13 is a flowchart illustrating an example of the write operation of the memory device according to the first embodiment.

FIG. 13 is a flowchart illustrating an example of the write operation of the memory device MD according to the first embodiment. Hereinafter, the flow of the write operation of the memory device MD is described with reference to FIG. 13.

When the memory device MD receives the command of instructing the write operation from the memory controller 20 and the write data, the sequencer 104 of the memory device MD starts a series of processes of FIG. 13 (START).

First, the sequencer 104 performs the program operation (Step S110). The program operation is an operation of applying the program voltage to the memory cell transistor MT of the writing target. In the program operation, the memory cell transistor MT in the selected cell unit CU is set as a program target or program prohibition based on the write data stored in the sense amplifier unit SAU. In the memory cell transistor MT of the program target, the threshold voltage rises by the program operation. Meanwhile, in the memory cell transistor MT of the program prohibition, the rise of the threshold voltage is prevented by the program operation.

Subsequently, the sequencer 104 performs the first verification operation (Step S111). The first verification operation is a read operation of determining whether the threshold voltage of the memory cell transistor MT of the writing target reaches a desired state. In the write operation, a set including the program operation and the first verification operation are performed a plurality of times. In the following, a set including one time of the program operation and one time of the first verification operation is referred to as a "program loop". When the first verification operation is completed, the result of the first verification operation is transferred to the counter 110. For example, the counter 110 counts the number of memory cell transistors MT that does not pass the first verification operation, for each state.

Subsequently, the sequencer 104 determines whether the writing of the state of the verification target is completed, that is, determines a program pass, based on the count result of the counter 110 (Step S112).

When the "program pass" is not verified in the process of Step S112 (NO in Step S112), the sequencer 104 checks whether "Nloop>NloopMAX" is satisfied (Step S113). That is, the sequencer 104 determines whether a current number of times of the program loop Nloop exceeds a predetermined number of loops NloopMAX.

When "Nloop>NloopMAX" is not satisfied in the process of Step S113 (NO in Step S113), the sequencer 104 steps up a program voltage VPGM (Step S114). The details are described below with reference to FIG. 14. Thereafter, the sequencer 104 proceeds to the process of Step S110. That is, the sequencer 104 performs the next program loop.

When "Nloop>NloopMAX" is satisfied in the process of Step S113 (YES in Step S113), the sequencer 104 proceeds to the process of Step S115. When the "program pass" is verified in the process of Step S112 (YES in Step S112), that is, the program passes of all states are detected, the sequencer 104 proceeds to the process of Step S115.

In the process of Step S115, the sequencer 104 performs the second verification operation (Step S115). The second verification operation is the verification operation performed after the process of a plurality of times of the program loop (hereinafter, referred to as a loop process) is completed. In the second verification operation according to the first embodiment, the same verification voltage as in the first verification operation is used.

After the process of Step S115, the sequencer 104 updates the status information STS (Step S116). In the process of Step S116, the sequencer 104 stores the information on the program status pass in the status register 102A when the process of "YES in Step S112" is performed in the present write operation, and stores the information on the program status fail in the status register 102A when the process of "YES in Step S113" is performed. In addition, the sequencer 104 stores the result of the second verification operation in the status register 102A.

After the process of Step S116, the sequencer 104 ends a series of processes of FIG. 13 (END).

(Detailed Operation of Memory Devices MD in Write Operation)

Figures 14, 15:
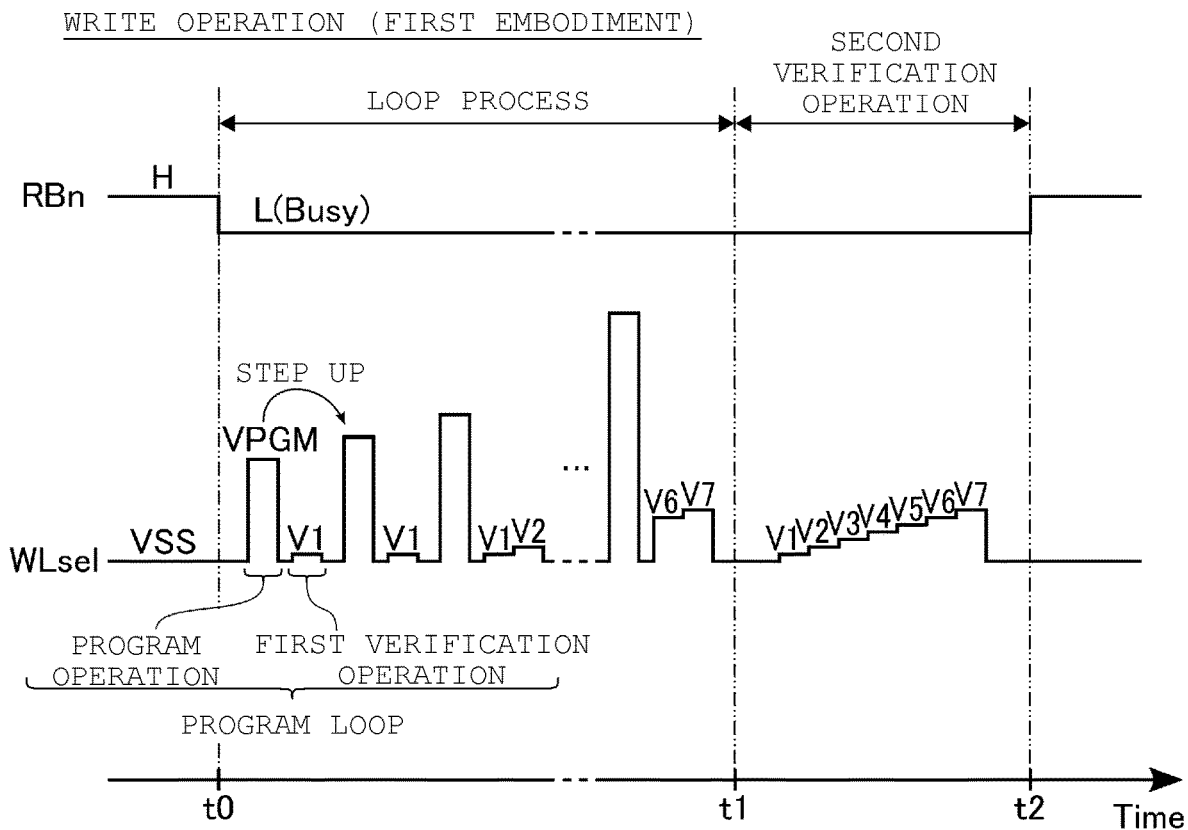
FIG. 14 is a timing chart illustrating an example of a voltage applied to a selected word line in the write operation of the memory device according to the first embodiment.
FIG. 15 is a table showing an example of a combination of a status corresponding to a result of the write operation in the memory device according to the first embodiment.

FIG. 14 is a timing chart illustrating an example of the voltage applied to a selected word line WLsel in the write operation of the memory device MD according to the first embodiment. FIG. 14 illustrates the state of the ready/busy signal RBn and the state of the voltage applied to the selected word line WLsel in the write operation. Further, the voltage of the selected word line WLsel before the write operation starts is, for example, VSS. Time t0 corresponds to start time of the write operation of the memory device MD, time t1 corresponds to start time of the second verification operation, and time t2 corresponds to end time of the write operation of the memory device MD. As illustrated in FIG. 11, when the write operation starts, the sequencer 104 causes the memory device MD to transition from the ready state to the busy state and performs the loop process.

In the program operation, the program voltage VPGM is applied to the selected word line WLsel. The program voltage VPGM is a high voltage that can raise the threshold voltage of the memory cell transistor MT. When the program voltage VPGM is applied to the selected word line WLsel, the threshold voltage of the memory cell transistor MT of the program target rises. Whenever the program loop is repeated, the program voltage VPGM steps up and increases according to the number of times of the performed program loop.

In the first verification operation, the read operation using the verification voltage is performed. That is, while the verification voltage is applied, the control signal STB is asserted. Each sense amplifier unit SAU determines whether the voltage exceeds the verification voltage in accordance with the write data to be stored. In the verification operation, the type and the number of the verification voltage applied to the selected word line WLsel are appropriately changed according to the progress of the program loop. For example, in the program loop for the first time, the read operation using the verification voltage V1 is performed.

When the program pass of all states is detected (YES in S112) or a fact that the number of times of the program loop exceeds a predetermined number of times is detected (YES in S113), the sequencer 104 starts the second verification operation. At the start of the second verification operation, each sense amplifier unit SAU stores the write data with reference to the program loop as it is. In the second verification operation, for example, the verification voltages V1 to V7 are sequentially applied to the selected word line WLsel. Also, while each of the verification voltages V1 to V7 is applied, the control signal STB is asserted, and each sense amplifier unit SAU stores the read result when the verification voltage in accordance with the write data to be stored is applied to any internal latch circuit.

Then, the sequencer 104 performs the process of Step S116. Thereafter, the sequencer 104 causes the memory device MD to transition from the busy state to the ready state. That is, when the status information STS is updated based on the result of the loop process and the result of the second verification operation, the sequencer 104 causes the memory device MD to transition to the ready state.

(Status Reading Result Output by Memory Device MD)

FIG. 15 is a table showing an example of the combination of the status corresponding to the result of the write operation in the memory device MD according to the first embodiment. Hereinafter, the status reading result output by the memory device MD is described with reference to FIG. 15.

In the present table, a "parameter" includes a "program status", a "second verification status", and an "output information (write result)". In the write operation, the "program status" is set to a "pass (for example, data of "0")" when the process of "YES in Step S112" of FIG. 13 is performed, and is set to a "fail (for example, data of "1")" when the process of "YES in Step S113" of FIG. 13 is performed. In the second verification operation, the "second verification status" is set to "pass" when all verifications of the states in which the verification reading is performed are passes, and is set to "fail" when at least one of the verifications of the states in which the verification reading is performed is a fail. In the present example, the "output information" corresponds to the result of the OR operation of the "program status" and the "second verification status".

In the present table, the "status" corresponds to the combination of the "parameters", and includes four types of combinations of (1) to (4) in the present example. (1) of FIG. 15 is a combination in which both the "program status" and the "second verification status" are "passes". (2) of FIG. 15 is a combination in which the "program status" is a "pass", and the "second verification status" is a "fail". (3) of FIG. 15 is a combination in which both the "program status" and the "second verification status" are "fails". (4) of FIG. 15 is a combination in which the "program status" is a "fail", and the "second verification status" is a "pass". Therefore, the output information of (1), (2), (3), and (4) when the OR operation of the "program status" and the "second verification status" is performed is a "pass", a "fail", a "fail", and a "fail", respectively.

When the memory controller 20 detects that the status data corresponding to the output information (write result) stores information on the status fail by the first status reading, the block BLK that performs the write operation immediately before is registered as a defective block, for example, in the management table stored in the RAM 23. Also, the memory controller 20 does not use the block BLK registered as a defective block in subsequent operations.

[1-3] Effect of First Embodiment

In the memory device MD according to the first embodiment described above, the reliability of the data can be improved. Hereinafter, the details of the effect of the memory device MD according to the first embodiment is described.

For example, during the write operation, the memory device performs the program loop including the program operation and the verification operation, and thus the threshold voltage of the memory cell is raised to the height in accordance with the write data. However, in rare cases, even though the verification operation of the write operation is a pass, a read failure may occur in the read operation thereafter. The reasons thereof include erroneous determination during the verification read operation, overwriting, the presence of a bit that is unstably turned on and off during the read operation, and the like.

When the read failure occurs, as a method of preventing the failure of the data, using the restoration by the redundant arrays of inexpensive disks (RAID) is considered. The restoration ability of the data by the RAID depends on the performance of the memory controller. Also, when the data cannot be restored by the RAID, the failure of the data occurs, and the corresponding block is registered as a defective block. When the restoration mode of the RAID is used, the latency decreases, and thus it is preferable not to use the restoration mode of the RAID.

In order to prevent the occurrence of the read failure, it is preferable that the memory controller detects a bit that may be the read failure before the read failure occurs, that is, during the write operation, registers a block that may fail as a defective block, and does not use the block. When a bit that may fail is detected during the write operation, since the write data is stored in the RAM of the memory controller, or the memory device stores a parity bit, the memory controller can retry the write operation with another block as a target, and the occurrence of the latest read failure can be avoided.

Also, the memory device MD according to the first embodiment includes a function of detecting a bit that may be the read failure, during the write operation. In short, when the write operation starts based on the instruction from the memory controller 20, the memory device MD according to the first embodiment performs the process of a plurality of times of the program loop and the second verification operation corresponding to the detection of the read failure. In other words, the memory device MD according to the first embodiment performs the read operation (second verification operation) after the loop process as a part of the write operation and checks whether the read failure occurs. Also, the memory device MD updates the status information STS based on the result of the OR operation of the result of the loop process and the result of the second verification operation. Thereafter, the memory controller 20 determines whether the writing of the data succeeds based on the result of the first status reading. In this case, the information on whether the read failure immediately after the write operation may occur is reflected by the second verification operation, on the result of the first status reading to be checked by the memory controller 20.

As a result, the memory device MD according to the first embodiment can improve the reliability of the data to be stored and prevent the occurrence of the read failure. That is, the memory system 1 according to the first embodiment can decrease the usage frequency of the restoration mode of the RAID and prevent the decrease of the latency of the memory system 1. The memory system 1 according to the first embodiment can detect the read failure by the memory device MD. That is, the memory system 1 according to the first embodiment can detect the read failure during the write operation without increasing the load of the memory controller 20, and thus the cost of the memory controller 20 can be reduced.

[1-4] Modification of First Embodiment

The memory system 1 according to the first embodiment may be modified in various ways. Hereinafter, a first modification, a second modification, and a third modification of the first embodiment are sequentially described.

(First Modification of First Embodiment)

The first modification of the first embodiment limits the states of the target for performing the verification read in the second verification operation to a part of the state. For example, when the data allocation illustrated in FIG. 9 is used, the memory device MD according to the first modification of the first embodiment is configured to be able to select the target state of the second verification operation for each page.

FIG. 16 is a table showing an example of a combination of the target page of the second verification operation and the target state of the second verification operation in the write operation according to the first modification of the first embodiment. As illustrated in FIG. 16, in the first modification of the first embodiment, for example, as the target page of the second verification operation, the "upper page", the "medium page", and the "lower page" may be selected. In this case, as the target state of the second verification operation, the "S3" and "S7" states are selected when the upper page is selected, the "S2", "S4", and "S6" states are selected when the medium page is selected, and the "S1" and "S5" states are selected when the lower page is selected.

The "second verification status" in the first modification of the first embodiment is set to a "pass" when all are passes in the verifications of the states in which the verification reading is performed in the second verification operation, and is set to a "fail" when at least one of the verifications of the states in which the verification reading is performed is a fail. The setting of the target page of the second verification operation may be changed and may be preset based on the instruction of the memory controller 20. Accordingly, the memory device MD according to the first modification of the first embodiment selectively performs the second verification operation with a page in which the failure easily occurs as a target, and a second verification operation using a page in which a failure occurrence rate is low as a target can be omitted. As a result, the memory device MD according to the first modification of the first embodiment prevents the decrease of the failure detection accuracy by the second verification operation, and also the time for the write operation can be reduced.

Further, in the above description, the target state of the second verification operation is set with the page as a reference. However, at least one embodiment is not limited thereto. The memory device MD may perform the second verification operation with a specific state as a target, regardless of the page. In this case, it is considered to select, for example, the lowest state (for example, the "S0" state) or the highest state (for example, the "S7" state) of the occurrence of the failure, as the target state of the second verification operation. Accordingly, the memory device MD can detect the failure over a plurality of pages at a minimum number of times of the verification reading.

(Second Modification of First Embodiment)

The second modification of the first embodiment sets the verification voltage of the first verification operation and the verification voltage of the second verification operation to different voltages. In the following, the verification voltage used for the verification reading of an "S(x)" ("x" is an integer of 1 or more)" state is referred to as "V(x)a" in the first verification operation, and the verification voltage used for verification reading of the "S(x)" state in the second verification operation is referred to as "V(x)b".

FIG. 17 is a threshold voltage distribution diagram illustrating an example of the settings of the verification voltages used in the first verification operation and the second verification operation in the write operation according to the second modification of the first embodiment. The vertical axis and the horizontal axis correspond to "NMTs" and "Vth", respectively. In FIG. 17, "S(x−1)" and "S(x)" states are extracted and illustrated. As illustrated in FIG. 17, the verification voltage V(x)a of the "S(x)" state is set between the "S(x−1)" state and the "S(x)" state. Also, in the second modification of the first embodiment, the verification voltage V(x)b of the "S(x)" state is set between the "S(x−1)" state and the "S(x)" state, and to the voltage of the verification voltage V(x)a or more.

The setting of the verification voltage V(x)b is given, for example, by a parameter indicating the change amount with respect to the verification voltage V(x)a. The change amount with respect to the verification voltage V(x)a of the verification voltage V(x)b may be the same or different for each state. The memory controller 20 can change the setting of the verification voltage V(x)b by a setting changing command described below. Further, the setting of the verification voltage V(x)b may be preset in the memory device MD.

When the verification voltage V(x)b is set to be high, the condition for passing the second verification operation becomes strict, the reliability of the data written to the cell unit CU is improved. Meanwhile, the number of fails of the second verification operation accompanied by the deterioration of the memory device MD increases, and the blocks BLK to be registered as the defective block increases easily. That is, when the verification voltage V(x)b is set to be high, the reliability of the data is improved, the pace of decreasing the storage capacity accompanied by the deterioration of the memory device MD becomes faster.

When the verification voltage V(x)b is set to be low, the condition for passing the second verification operation is relaxed, and the reliability of the data written to the cell unit CU is lower than that when the verification voltage V(x)b is set to be high. Meanwhile, the number of fails of the second verification operation accompanied by the deterioration of the memory device MD decreases, and the increase in the number of blocks BLK to be registered as the defective block is more gradual than that when the verification voltage V(x)b is set to be high. That is, when the verification voltage V(x)b is set to be low, the reliability of the data slightly decreases, and the pace of decreasing the storage capacity accompanied by the deterioration of the memory device MD becomes slow.

Based on the above, it is considered that the user changes the verification voltage V(x)b according to a specification desired for the memory system 1. That is, in the second modification of the first embodiment, the user can appropriately change the verification voltage V(x)b, and thus it is possible to implement the memory system 1 having the performance that meets the user's wishes.

(Third Modification of First Embodiment)

In the third modification of the first embodiment, the number of ignored bits in the first verification operation and the number of ignored bits in the second verification operation are set to different numbers. The "number of ignored bits" corresponds to an allowed number of memory cell transistors MT that does not pass the verification in the determination of the verification passes for each state. In the following, the number of ignored bits of the first verification operation is referred to as "Nbd1", and the number of ignored bits of the second verification operation is referred to as "Nbd2".

FIG. 18 is a threshold voltage distribution diagram illustrating an example of the setting of the number of ignored bits in the write operation according to the third modification of the first embodiment. The vertical axis and the horizontal axis respectively correspond to "NMTs" and "Vth". In FIG. 18, "S(x−1)" and the "S(x)" states are extracted and illustrated. As illustrated in FIG. 18, when the verification voltage V(x) overlaps with the "S(x)" state, the memory cell transistor MT having the threshold voltage of the verification voltage V(x) or lower in the "S(x)" state is detected as a fail bit FB. The fail bit FB corresponds to the memory cell transistor MT of the verification fail. Also, in the third modification of the first embodiment, the number of ignored bits of the second verification operation Nbd2 is set to the value equal to or lower than the number of ignored bits of the first verification operation Nbd1.

The setting of the number of ignored bits Nbd2 is given, for example, by the parameter indicating the change amount with respect to the number of ignored bits Nbd1. The change amount of the number of ignored bits Nbd2 with respect to the number of ignored bits Nbd1 may be the same or different for each state. The memory controller 20 can change the setting of the number of ignored bits Nbd2 by the setting changing command. Further, the setting of the number of ignored bits Nbd2 may be preset in the memory device MD.

If the number of ignored bits Nbd2 is set to be small, the condition for passing the second verification operation becomes strict, and the reliability of the data written to the cell unit CU is improved. Meanwhile, the number of fails of the second verification operation accompanied by the deterioration of the memory device MD increases, and the blocks BLK to be registered as the defective block easily increase. That is, when the number of ignored bits Nbd2 is set to be small, the reliability of the data is improved, and the pace of decreasing the storage capacity accompanied by the deterioration of the memory device MD becomes faster.

When the number of ignored bits Nbd2 is set to be large, the condition for passing the second verification operation is relaxed, and the reliability of the data written to the cell unit CU is lower than that when the number of ignored bits Nbd2 is set to be small. Meanwhile, when the number of fails of the second verification operation accompanied by the deterioration of the memory device MD decreases, and the increase in the number of blocks BLK to be registered as the defective blocks becomes more gradual than that when the number of ignored bits Nbd2 is set to be small. That is, when the number of ignored bits Nbd2 is set to be large, the reliability of the data slightly decreases, and the pace of decreasing the storage capacity accompanied by the deterioration of the memory device MD becomes slow.

Based on the above, it is considered that the user changes the number of ignored bits Nbd2 according to the specification desired for the memory system 1. That is, in the third modification of the first embodiment, the user can appropriately change the number of ignored bits Nbd2, and thus it is possible to implement the memory system 1 having the performance that meets the user's wishes.

[2] Second Embodiment

The memory system 1 according to a second embodiment has the same configuration as in the first embodiment. Also, the memory system 1 according to the second embodiment determines whether to perform the second verification operation according to the address of the string unit SU of the writing target. Hereinafter, the difference of the memory system 1 according to the second embodiment from the first embodiment is described.

[2-1] Flow of Write Operation

Figure 19:
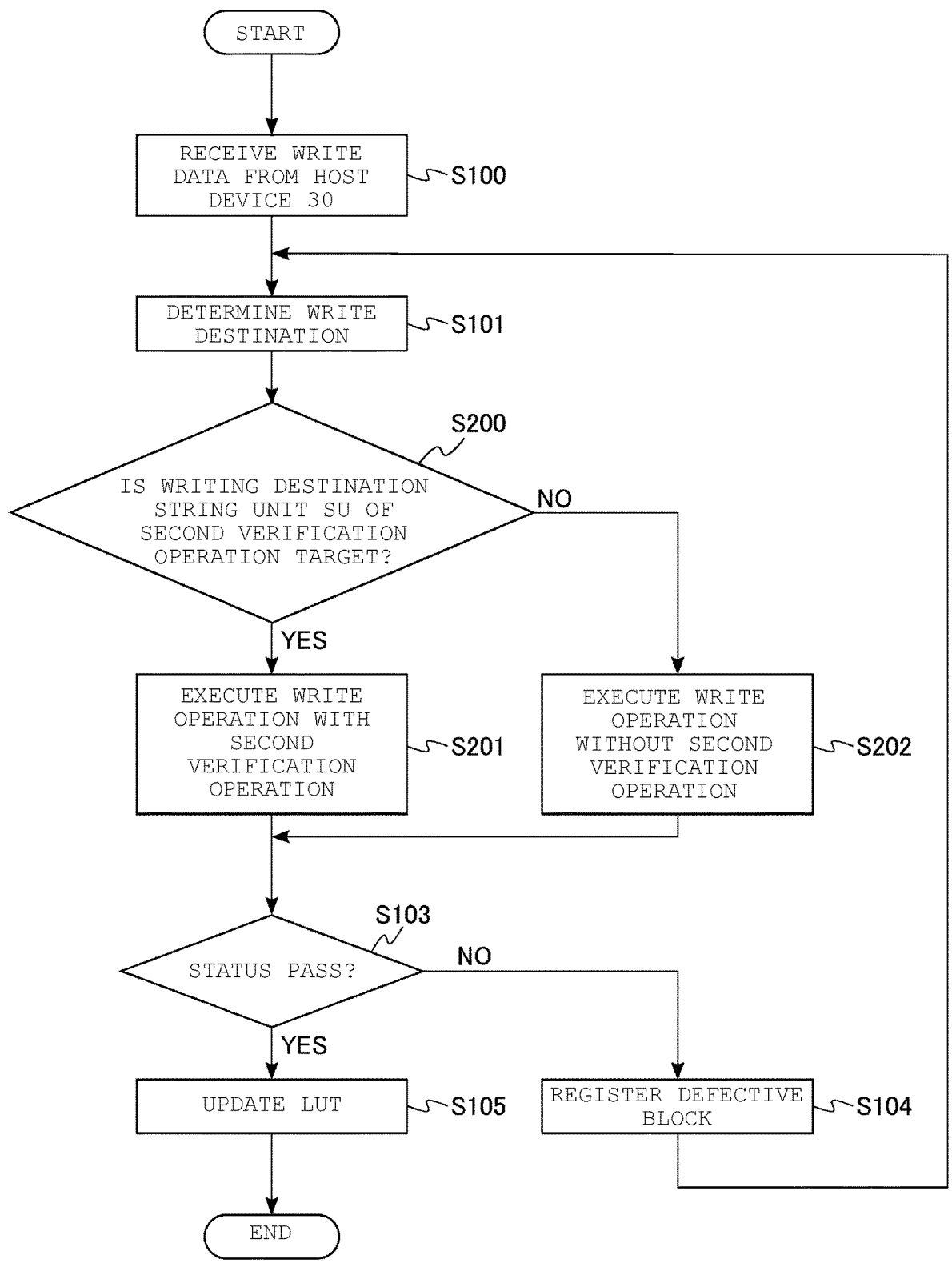
FIG. 19 is a flowchart illustrating an example of the write operation in a memory system according to a second embodiment.

FIG. 19 is a flowchart illustrating an example of the write operation of the memory system 1 according to the second embodiment. As illustrated in FIG. 19, the write operation according to the second embodiment has the configuration in which the process of Step S102 is replaced with the processes of Steps S200 to S202 in the write operation described with reference to FIG. 10 in the first embodiment.

Specifically, in the same manner as in the first embodiment, the memory controller 20 receives write data from the host device 30 (Step S100) and determines the write destination (Step S101). Also, the memory controller 20 checks whether the write destination is the string unit SU of the second verification operation target (Step S200). The string unit SU of the second verification operation target is set before the operation by the user. As the string unit SU of the second verification operation target, in the manufacturing process of the memory device MD, the string unit SU in which the failure easily occurs is selected. Examples of the string unit SU in which the failure easily occurs include the string unit SU adjacent to the slit SLT.

When the write destination is the second verification operation target (YES in Step S200), the memory controller 20 performs the write operation including the second verification operation (Step S201). After the process of Step S201 is performed, the memory controller 20 proceeds to the process of Step S103.

When the write destination is not the second verification operation target (NO in Step S200), the memory controller 20 performs the write operation not including the second verification operation (Step S202). After the process of Step S202 is performed, the memory controller 20 proceeds to the process of Step S103.

For example, the memory device MD distinguishes the instruction of the write operation including the second verification operation with respect to the memory device MD and the instruction of the write operation not including the second verification operation with respect to the memory device MD by a prefix command. For example, when the write operation including the second verification operation is instructed to the memory device MD, the memory controller 20 first transmits the prefix command to the memory devices MD and then transmits the command set of the write operations such as (1) to (3) of FIG. 11 to the memory device MD. Further, a method of distinguishing whether the memory device MD performs the second verification operation may be the other method. Whether the memory device MD performs the second verification operation may be determined by referring to the address information ADD.

In the process of Step S103, the memory controller 20 checks whether the status of the write operation is a pass in the same manner as in the first embodiment (Step S103). The operations other than the write operation in the second embodiment are the same as those in the first embodiment.

[2-2] Effect of Second Embodiment

As described above, in the write operation, the memory device MD according to the second embodiment omits the second verification operation using the string unit SU, which is presumed to be less likely to cause the read failure, as the target and performs the second verification operation using the string unit SU, which is presumed that the read failure easily occurs, as the target. As a result, the memory device MD according to the second embodiment prevents the decrease of the reliability of the data, and also the time for the second verification operation can be reduced.

[2-3] Modification of Second Embodiment

Figure 20:
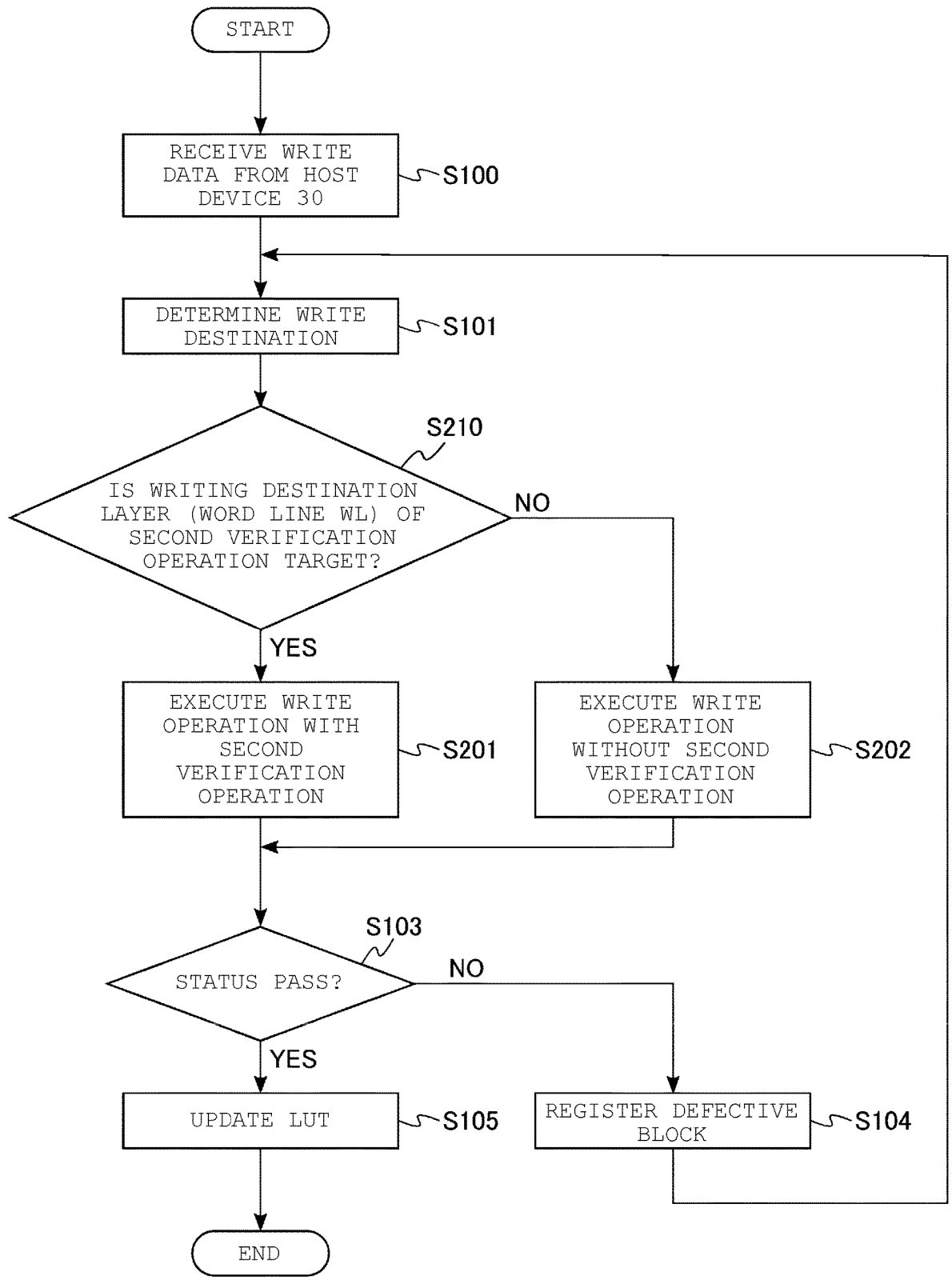
FIG. 20 is a flowchart illustrating an example of the write operation in a modification of the second embodiment.

FIG. 20 is a flowchart illustrating an example of the write operation in a modification of the second embodiment. As illustrated in FIG. 20, the write operation in the modification of the second embodiment has the configuration in which the process of Step S200 is replaced with the process of Step S210 in the write operation described with reference to FIG. 19 in the second embodiment.

Specifically, the memory controller 20 receives the write data from the host device 30 (Step S100) and determines the write destination (Step S101) in the same manner as in the first embodiment. Also, the memory controller 20 checks whether the write destination is a layer of the second verification operation target (the word line WL) (Step S210). The word line WL of the second verification operation target is set before the operation by the user. As the word line WL of the second verification operation target, in the manufacturing process of the memory device MD, the word line WL in which the failure easily occurs is selected. Examples of the word line WL in which the failure easily occurs include the word line WL close to the bottom portion of the memory pillar MP (for example, the word line WL0) and the word line WL close to the joint layer JT of the memory pillar MP (for example, the word lines WL6 and WL7).

When the write destination is the second verification operation target (YES in Step S210), the memory controller 20 performs the write operation including the second verification operation in the same manner as in the second embodiment (Step S201). When the write destination is not the second verification operation target (NO in Step S210), the memory controller 20 performs the write operation not including the second verification operation in the same manner as in the second embodiment (Step S202). The operations other than the write operation in the modification of the second embodiment are the same as the second embodiment.

As described above, the condition for determining whether to perform the second verification operation in the write operation in the process of Step S200 described in the second embodiment may be the other conditions. Also, in this case, the memory system 1 according to the modification of the second embodiment can obtain the effect that is the same as in the second embodiment.

[3] Third Embodiment

The memory system 1 according to a third embodiment has the same configuration as the first embodiment. Also, the memory system 1 according to the third embodiment performs the second verification operation a plurality of times in the write operation. Hereinafter, the difference of the memory system 1 according to the third embodiment from the first embodiment is described.

[3-1] Flow of Write Operation

Figure 21:
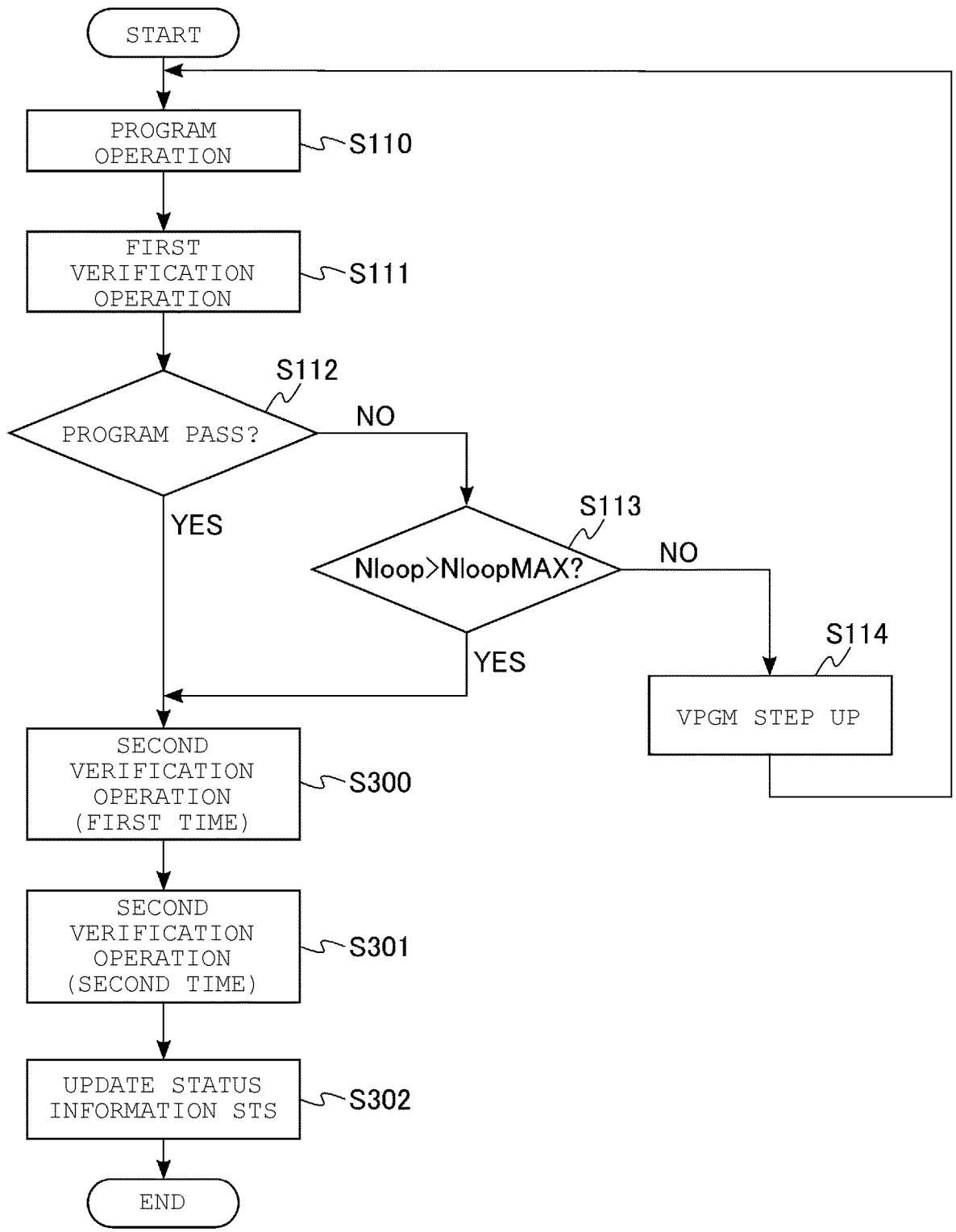
FIG. 21 is a flowchart illustrating an example of a write operation of a memory device according to a third embodiment.

FIG. 21 is a flowchart illustrating an example of the write operation of the memory device MD according to the third embodiment. As illustrated in FIG. 21, the write operation in the third embodiment has the configuration in which the processes before Step S115 are replaced with processes of Steps S300 to S302 in the write operation described with reference to FIG. 13 in the first embodiment.

Specifically, the sequencer 104 performs the loop process in the same manner as in the first embodiment (Steps S110 to S114). Also, when the "program pass" is verified in the process of Step S112 (YES in Step S112) or "Nloop>NloopMAX" in the process of Step S113 is satisfied (YES in Step S112), the sequencer 104 proceeds to the process of Step S300.

In the process of Step S300, the sequencer 104 performs the second verification operation for the first time. The second verification operation of the first time is the same as the second verification operation described in the first embodiment. When the process of Step S300 is completed, the sequencer 104 proceeds to the process of Step S301.

In the process of Step S301, the sequencer 104 performs the second verification operation for the second time. The second verification operation of the second time uses the same verification voltage as the second verification operation of the first time. When the process of Step S301 is completed, the sequencer 104 proceeds to the process of Step S302.

In the process of Step S302, the sequencer 104 updates the status information STS. In the process of Step S302, the sequencer 104 stores the result of the second verification operation of the first time and the result of the second verification operation of the second time in the status register 102A. The other information stored in the status register 102A in the process of Step S302 is the same as that in Step S116 described in the first embodiment.

In the third embodiment, as the "second verification status" used for the arithmetic operation of the write result, the result of the OR operation of the result of the second verification operation of the first time and the result of the second verification operation of the second time are used. That is, the sequencer 104 sets the second verification status to be a "pass" when the result of the verification pass is obtained at least one time by the second verification operation performed a plurality of times.

After the process of Step S302, the sequencer 104 ends a series of processes of FIG. 21 (END). The operations other than the write operation in the third embodiment are the same as the first embodiment. Further, the number of times of performing the second verification in the write operation by the memory device MD according to the third embodiment is not limited to two times and may be at least a plurality of times. In the third embodiment, the sequencer 104 may determine the second verification status based on the result of the second verification operation a plurality of times.

[3-2] Effect of Third Embodiment

As described above, in the write operation, the memory device MD according to the third embodiment performs the second verification operation a plurality of times and notifies the status information STS to the memory controller 20 based on the result of a plurality of times of the second verification operation. Accordingly, when the verification target is an unstable bit, the memory device MD according to the third embodiment can increase the likeliness of detecting that the threshold voltage of the memory cell transistor MT corresponding to the corresponding bit exceeds the desired threshold voltage. As a result, the memory device MD according to the third embodiment can prevent the excessive registration of defective blocks and can control the pace of decreasing the storage capacity of the memory device MD.

[4] Fourth Embodiment

The memory system 1 according to a fourth embodiment has the same configuration as the first embodiment. Also, in the write operation, the memory system 1 according to the fourth embodiment retries the second verification operation according to the result of the second status reading. Hereinafter, the difference of the memory system 1 according to the fourth embodiment from the first embodiment is described.

[4-1] Operation (Flow of Write Operation)

Figure 22:
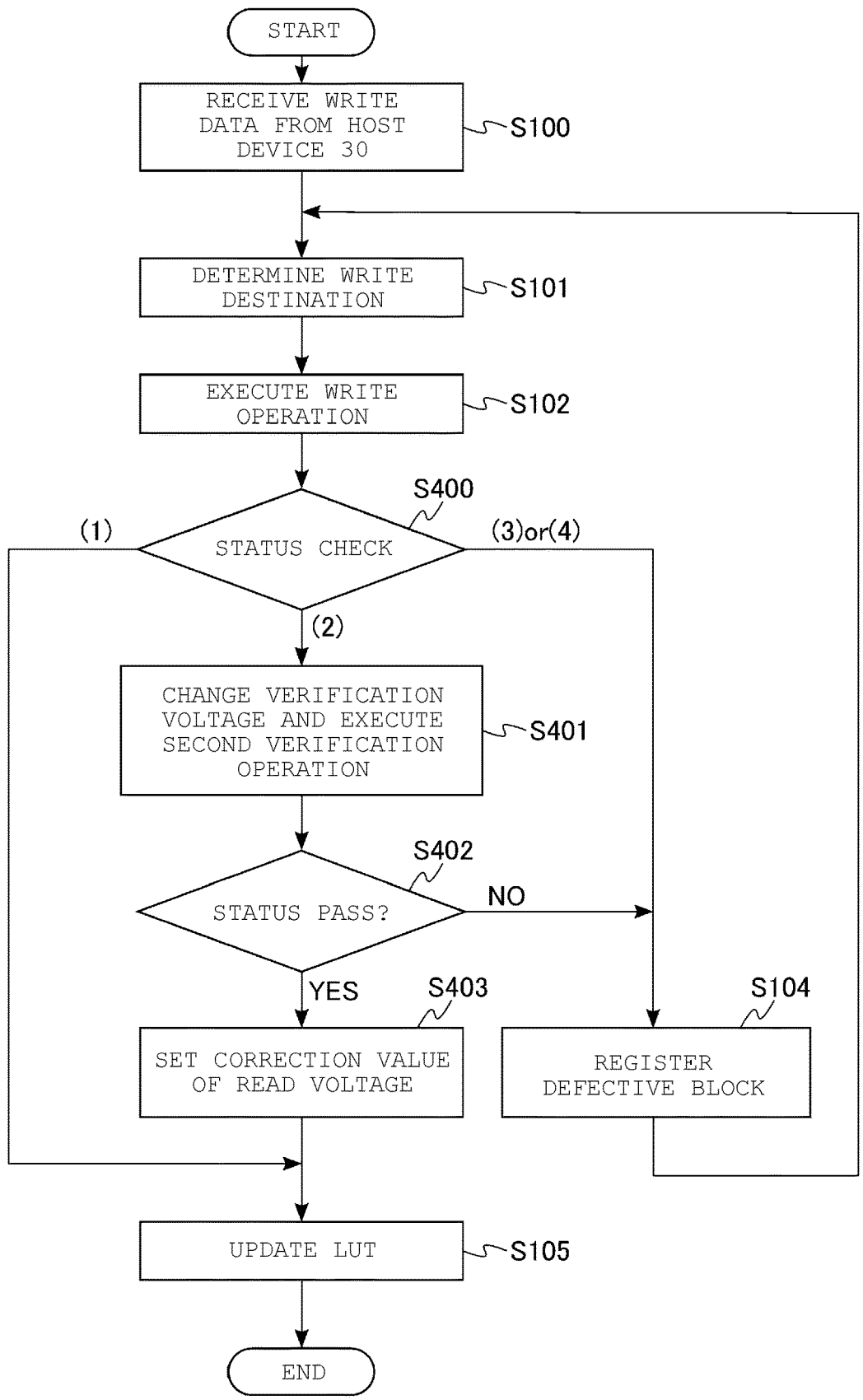
FIG. 22 is a flowchart illustrating an example of a write operation of a memory system according to a fourth embodiment.

FIG. 22 is a flowchart illustrating an example of the write operation of the memory system 1 according to the fourth embodiment. As illustrated in FIG. 22, the write operation according to the fourth embodiment has the configuration in which the process of Step S103 is excluded and the processes of Steps S400 to S403 are added with respect to the write operation described with reference to FIG. 10 in the first embodiment.

Specifically, the memory controller 20 receives the write data from the host device 30 (Step S100), determines the write destination (Step S101), and performs the write operation (Step S102) in the same manner as in the first embodiment. Also, the memory controller 20 performs the second status reading and checks the status information STS (Step S400). The memory controller 20 in the process of Step S400 checks which combination of the plurality of combinations of the statuses described with reference to FIG. 15 in the first embodiment is the status information STS obtained by the second status reading.

When both the "program status" and the "second verification status" are "passes" as (1) of FIG. 15 ((1) of Step S400), the memory controller 20 proceeds to the process of Step S105.

When both the "program status" and the "second verification status" as (3) of FIG. 15 are "fails" ((3) of Step S400) or the "program status" and the "second verification status" are a "fail" and a "pass", respectively, as (4) of FIG. 15 ((4) of Step S400), the memory controller 20 proceeds to the process of Step S104.

The "program status" and the "second verification status" as (2) of FIG. 15 are a "pass" and a "fail", respectively ((2) of Step S400), the memory controller 20 proceeds to the process of Step S401.

In the process of Step S401, the memory controller 20 changes the verification voltage and performs the second verification operation. For example, a setting changing command described below is used for the change of the verification voltage used for the second verification operation. Further, according to the fourth embodiment, when the memory controller 20 in Step S401 instructs the memory device MD to perform the second verification operation, the memory device MD stores the write data received in Step S102 as it is. The memory device MD generates the second verification status based on the read result of the second verification operation performed based on the write data stored by the sense amplifier units SAU and the instruction by the memory controller 20 in the same manner as in the first embodiment.

When the process of Step S401 is completed, the memory controller 20 reads the status information STS from the memory device MD by the second status reading and checks whether the second verification status is a "pass", that is, checks a status pass (Step S402).

When the status pass is not verified in the process of Step S402 (NO in Step S402), that is, the status fail is verified, the memory controller 20 registers the block BLK to which writing of the data is failed as a defective block (Step S104) and proceeds to the process of Step S101.

When the status pass is verified in the process of Step S402 (YES in Step S402), the memory controller 20 sets a correction value of the read voltage with respect to the word line WL where the write operation is performed based on the verification voltage of the changed second verification operation (Step S403). In the fourth embodiment, the verification voltage V(x)b of the second verification operation corresponds to the read voltage of the "S(x)" state. Therefore, the memory controller 20 can change the read voltage in the "S(x)" state according to voltage value of the verification voltage V(x)b that passes the verification reading.

When the process of Step S403 is completed, the memory controller 20 proceeds to the process of Step S105. The operations other than the write operation in the fourth embodiment are the same as those in the first embodiment. In the above description, the process of Step S401 is performed one time. However, the memory controller 20 may retry the process of Step S401 in case of the status fail in the process of Step S402. The number of times of retrying the process of Step S401 may be freely determined. The memory device MD performs the second verification operation using different verification voltages whenever the process of Step S401 is retried.

(Command Sequence of Write Operation)

Figures 23, 24:
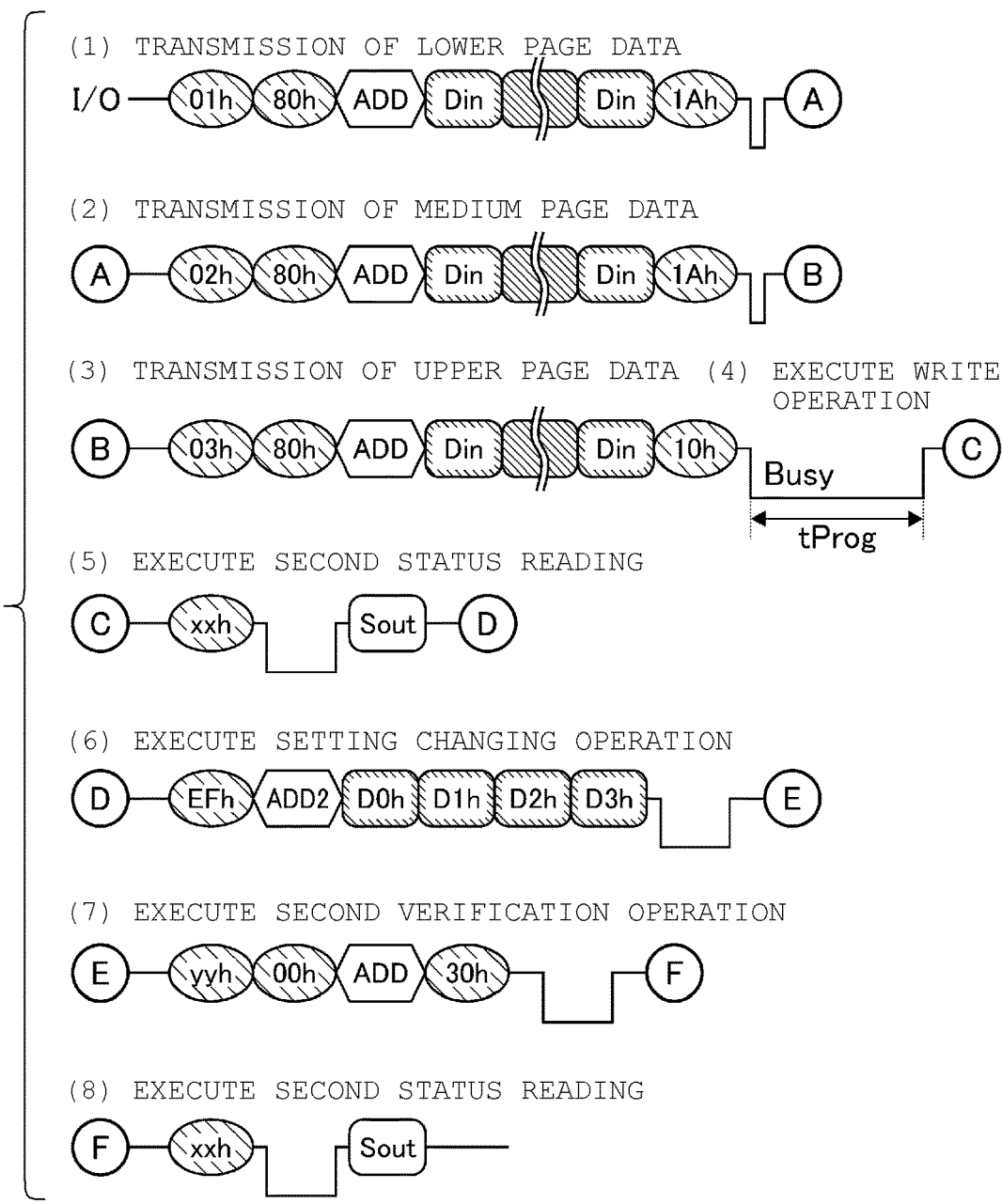
FIG. 23 is a schematic diagram illustrating an example of a command sequence of a write operation of a memory system according to the fourth embodiment.
FIG. 24 is a table showing an example of status information output from a memory device in the write operation of the memory system according to the fourth embodiment.

FIG. 23 is a schematic diagram illustrating an example of a command sequence in the write operation of the memory system 1 according to the fourth embodiment. Hereinafter, an example of a command sequence of write operations in the memory system 1 according to the fourth embodiment is described with reference to FIG. 23.

The sequences illustrated in (1) to (4) of FIG. 23 are the same as the sequences of (1) to (4) of FIG. 11. In short, the memory controller 20 causes the memory device MD to transfer lower page data ((1) of FIG. 23), transfer the medium page data ((2) of FIG. 23), transfer the upper page data ((3) of FIG. 23), and perform the write operation ((4) of FIG. 23).

Also, as illustrated in (5) of FIG. 23, the memory controller 20 performs the second status reading. Specifically, the memory controller 20 transmits a command "xxh" to the memory device MD. The command "xxh" is a command associated with the second status reading. The memory device MD that receives the command "xxh" transmits the status information "Sout" stored in the status register 102A to the memory controller 20. Also, the memory controller 20 checks the status of the write operation with reference to the status information "Sout" (Step S400 of FIG. 22).

In the present example, in Step S400, it is verified that the "program status" and the "second verification status" are a "pass" and a "fail", respectively. In this case, the memory controller 20 performs a setting changing operation as illustrated in (6) of FIG. 23. Specifically, the memory controller 20 transmits a command "EFh", address information "ADD2", setting data "D0h", "D1h", "D2h", and "D3h" to the memory device MD in this order. The command "EFh" is a command associated with the first status reading. The address information "ADD2" indicates, for example, an address at which a parameter corresponding to the verification voltage used in the second verification operation is stored. The setting pieces of data "D0h" to "D3h" in the fourth embodiment include parameters applied to the verification voltages used for the second verification operation.

When the address information "ADD2" and the setting data "D0h" to "D3h" are received after the command "EFh" is received, the memory device MD transitions from the ready state to the busy state. Also, the memory device MD changes the parameter corresponding to the verification voltage used for the second verification operation to the parameter in the setting data "D0h" to "D3h". When the setting change is completed, the memory device MD transitions from the busy state to the ready state and ends the setting changing operation. Further, the setting data may be transmitted in at least one cycle and may be transmitted at cycles in the same number as the number of cycles associated with the command "EFh". The setting changing operation can change the other parameters by changing the address and the setting data.

Subsequently, as illustrated in (7) of FIG. 23, the memory controller 20 performs the second verification operation. Specifically, the memory controller 20 transmits a command "yyh", a command "00h", the address information "ADD", and a command "30h" to the memory device MD in this order. The command "yyh" is a command for instructing the performance of the second verification operation. The command "00h" is a command for instructing the read operation. The command "30h" is a command for instructing the start of the read operation. The memory device MD that receives these commands and the like transitions to the busy state, performs the second verification operation, and transitions to the ready state when the second verification operation is completed.

Subsequently, the memory controller 20 performs the second status reading as illustrated in (8) of FIG. 23. The command sequence of the second status reading is the same as (5) of FIG. 23.

(Status Information STS Obtained by Second Status Reading)

FIG. 24 is a table showing an example of the status information STS output from the memory device MD in the write operation of the memory system 1 according to the fourth embodiment. As illustrated in FIG. 24, the status information STS obtained by the second status reading in the fourth embodiment includes data indicating the write result, data indicating the program fail (Loop Max), and data indicating the result of the second verification operation. The data indicating the write result is transmitted, for example, via I/O0. The data indicating the program fail is transmitted, for example, via I/O1. For example, the data of "0" of I/O1 indicates that the program loop ends within a predetermined number of times, and the data of "1" of I/O1 indicates that the program loop does not end within a predetermined number of times. The data indicating the result of the second verification operation is transmitted, for example, via I/O2. For example, the data of "0" of I/O2 indicates that the second verification operation is failed, and the data of "1" of I/O2 indicates that the second verification operation is passed. Further, in the status information STS obtained by the second status reading, the data indicating the write result may be omitted. In the allocation with respect to the input/ output signal I/O of the status information STS in the second status reading may be the other allocations.

[4-2] Effect of Fourth Embodiment

As described above, in the memory system 1 according to the fourth embodiment, the memory controller 20 can grasp whether the loop process is failed or the second verification operation is failed by the second status reading. Also, when the loop process is passed and the second verification operation is failed, the memory controller 20 changes the verification voltage used in the second verification operation and retries the second verification operation. Then, the memory controller 20 registers the corresponding block BLK as the defective block in case of the verification fail according to the result of the retried second verification operation and determines the correction value of the read voltage using the word line WL that performs the write operation in case of verification pass, as the target. Accordingly, the memory system 1 according to the fourth embodiment can use a more appropriate read voltage in the read operation after the write operation and can prevent the occurrence of the read failure. In addition, the memory system 1 according to the fourth embodiment restores the block BLK that can be used so that the excessive registration of defective blocks can be prevented, and the pace of decreasing the storage capacity of the memory device MD can be prevented.

[5] Fifth Embodiment

The memory system 1 according to a fifth embodiment has the same configuration as in the first embodiment. Also, in the write operation, the memory system 1 according to the fifth embodiment performs the second verification operation a plurality of times by varying the second verification voltage. Hereinafter, the difference of the memory system 1 according to the fifth embodiment from the first embodiment is described.

[5-1] Operation (Flow of Write Operation)

Figure 25:
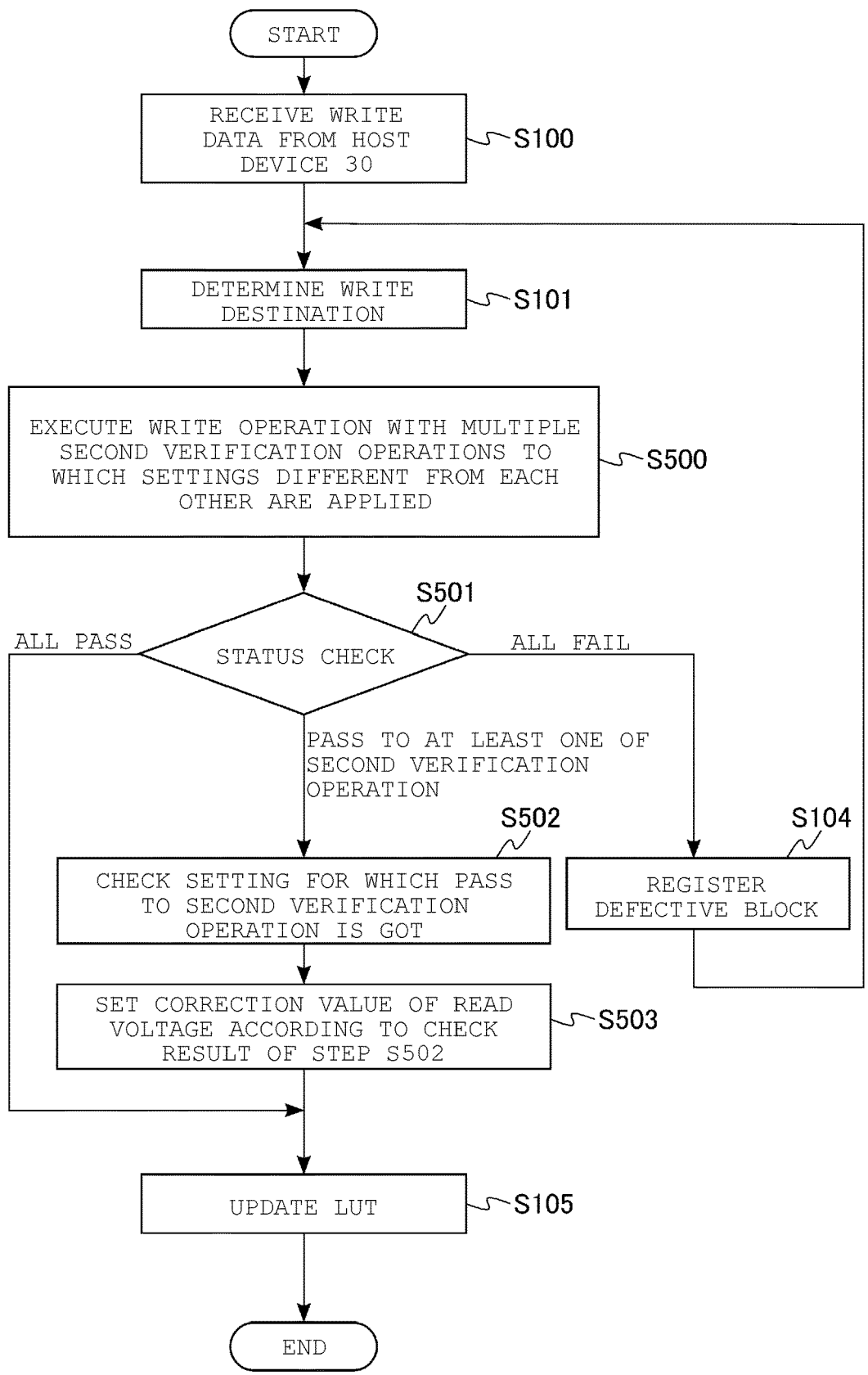
FIG. 25 is a flowchart illustrating an example of a write operation of a memory system according to a fifth embodiment.

FIG. 25 is a flowchart illustrating an example of the write operation of the memory system 1 according to the fifth embodiment. As illustrated in FIG. 25, the write operation in the fifth embodiment has the configuration in which the processes of Steps S102 and S103 are excluded and the processes of Steps S500 to S503 are added with respect to the write operation described with reference to FIG. 10 according to the first embodiment.

Specifically, the memory controller 20 receives the write data from the host device 30 (Step S100) and determines the write destination (Step S101) in the same manner as in the first embodiment. Also, the memory controller 20 performs the write operation including the plurality of second verification operations to which different settings are applied (Step S500).

Subsequently, the memory controller 20 performs the second status reading and checks the status information STS (Step S501). The memory controller 20 in the process of Step S501 checks the respective results of the second verification operation performed a plurality of times based on the status information STS obtained by the second status reading.

When the "program status" is a "pass", and all statuses of the plurality of times of the second verification operation are passes (all are passes in Step S501), the memory controller 20 proceeds to the process of Step S105.

When the "program status" is a "fail", or the "program status" is a "pass", and all statuses of the plurality of times of the second verification operation are fails (all are fails in Step S501), the memory controller 20 proceeds to the process of Step S104.

When the "program status" is a "pass", and at least one status of the plurality of times of the second verification operation is a pass (at least one second verification operation is a pass in Step S501), the memory controller 20 proceeds to the process of Step S502.

In the process of Step S502, the memory controller 20 checks the setting in which the second verification operation is passed. In other words, the memory controller 20 checks at what times of the second verification operation the pass is got, from the result of the second status reading. When the process of Step S502 is completed, the memory controller 20 proceeds to the process of Step S503.

In the process of Step S503, the memory controller 20 sets the correction value of the read voltage to the word line WL to which the write operation is performed according to the checked result in Step S502. For example, if there is only one second verification operation that passes the verification, the memory controller 20 sets the correction value of the read voltage based on the verification voltage used in the second verification operation. Meanwhile, if there are two or more second verification operations that pass the verification, the memory controller 20 selects any one of the second verification operations that pass the verification based on a preset priority. Also, the memory controller 20 sets the correction value of the read voltage based on the verification voltage used for the selected second verification operation.

When the process of Step S503 is completed, the memory controller 20 proceeds to the process of Step S105. The operations other than the write operation in the fifth embodiment are the same as those in the first embodiment.

(The Status Information STS Obtained by Second Status Reading)

Figures 26, 27:
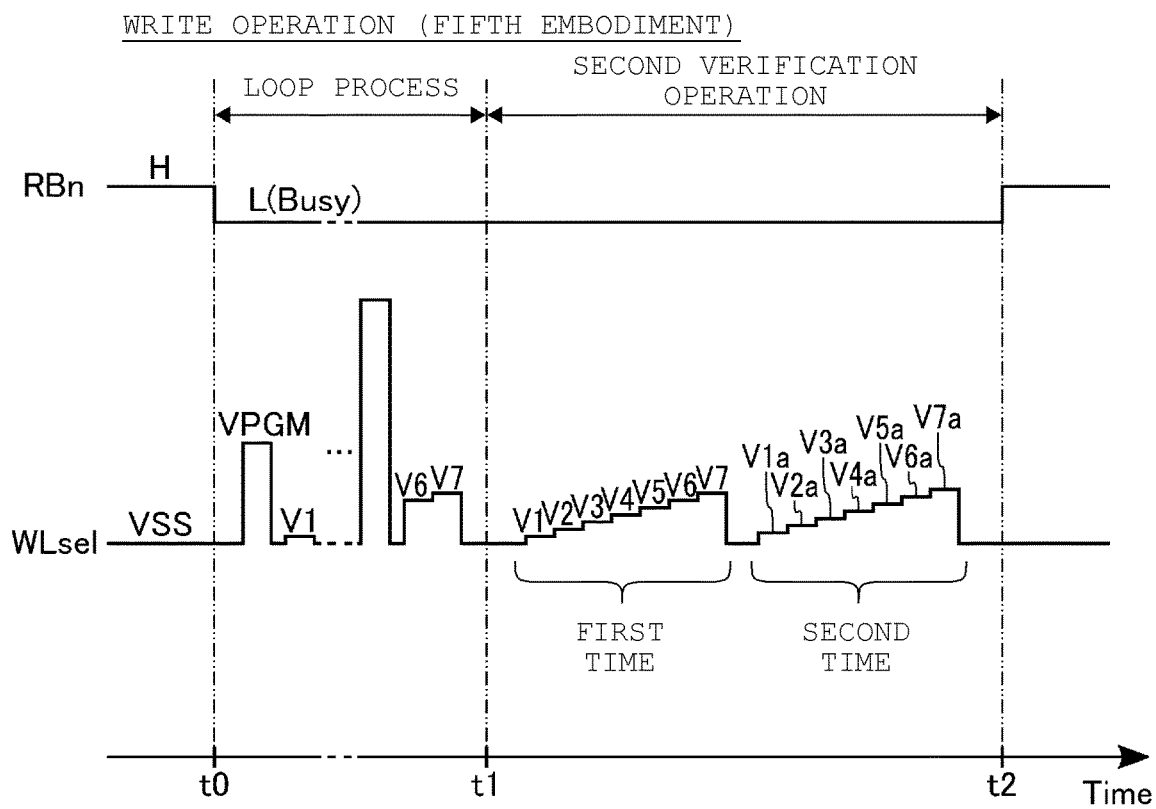
FIG. 26 is a table showing an example of status information output from a memory device in the write operation of the memory system according to the fifth embodiment.
FIG. 27 is a timing chart illustrating an example of a voltage applied to a selected word line in the write operation of the memory device according to the fifth embodiment.

FIG. 26 is a table showing an example of the status information output from the memory device MD in a write operation of the memory system 1 according to the fifth embodiment. As illustrated in FIG. 26, the status information STS obtained by the second status reading in the fifth embodiment includes data indicating the write result, data indicating the program fail (Loop Max), data indicating the result of the second verification operation of the first time, and data indicating the result of the second verification operation of the second time. The data indicating the write result is transmitted, for example, via I/O0. The data indicating the program fail is transmitted, for example, via I/O1. The data indicating the result of the second verification operation of the first time is transmitted, for example, via I/O2. The data indicating the result of the second verification operation of the second time is transmitted, for example, via I/O3. For example, data of "0" of I/O1 and I/O2 indicates that the second verification operation is failed, and data of "1" of I/O1 and I/O2 indicates that the second verification operation is passed. Further, in the status information STS obtained by the second status reading, the data indicating the write result may be omitted.

(Detailed Operation of Memory Device MD in Write Operation)

FIG. 27 is a timing chart indicating an example of the voltage applied to the selected word line WLsel in the write operation of the memory devices MD according to the fifth embodiment. As illustrated in FIG. 27, the write operation of the fifth embodiment is different from the write operation described with reference to FIG. 14 in the first embodiment in that the plurality of times of the second verification operation are performed.

Specifically, the memory device MD transitions from the ready state to the busy state, performs the loop process, and then performs the second verification operation of the first time and the second verification operation of the second time. In the second verification operation of the first time, for example, the verification voltages V1 to V7 are sequentially applied, and the verification results are stored in the corresponding sense amplifier unit SAU. In the second verification voltage of the second time, for example, verification voltage V1a to V7a higher than the verification voltages V1 to V7 respectively are sequentially applied, and the verification results are stored in the corresponding sense amplifier units SAU. Thereafter, the memory device MD transitions from the busy state to the ready state after the status register 102A is updated.

Further, in the fifth embodiment, the second verification operation of the first time and the second verification operation of the second time may not be sequentially performed. For example, the verification voltage V1 corresponding to the second verification voltage of the first time may be applied, then, the verification voltage V1a corresponding to the second verification voltage of the second time may be applied, . . . , the verification voltage V7 corresponding to the second verification voltage of the first time may be applied, and then the verification voltage V7a corresponding to the second verification voltage of the seventh time may be applied. That is, in the memory device MD according to the fifth embodiment, as long as the read result respectively corresponding to the plurality of times of the second verification voltage can be stored in the sense amplifier units SAU, the order of applying the verification voltage is not particularly limited.

[5-2] Effect of Fifth Embodiment

As described above, in the write operation, the memory device MD according to the fifth embodiment performs a plurality of times of the second verification operation in different verification voltage settings and notifies the respective results of the plurality of times of the second verification operation to the memory controller 20 by the second status reading. Also, the memory controller 20 determines the correction value of the read voltage using the word line WL that performs the write operation as the target according to the result of the second status reading. In this manner, in the memory system 1 according to the fifth embodiment, the memory controller 20 can grasp the results of the plurality of times of the second verification operation. As a result, the memory controller 20 can apply a more appropriate correction value as the read voltage used for the read operation by using the corresponding word lines WL as the target after the write operation. As a result, the memory system 1 according to the fifth embodiment can prevent the occurrence of the read failure.

[6] The Others

In the second verification operation according to the embodiment, the memory device MD may change the read voltage applied to the selected word line WLsel to a level higher from a low level or to a level lower from a high level. As long as the result of the second verification operation is not changed, the order in which the read voltages are applied may be appropriately changed. In the flowcharts that are referred to in the embodiments, as long as the same results as in the corresponding embodiments can be obtained, the process order may be changed or the other processes may be added within an available range. In at least one embodiment, the operation in a case where one memory cell transistor MT stores 3-bit data is exemplified, the operations of the embodiments may be applied when one memory cell transistor MT stores 2-bit data or 4 or more-bit data.

The command sequences exemplified in the embodiments are merely examples. For example, the commands "01h" to "03h", "xxh", and "yyh" used in the description may be replaced with the other commands. A command that designates a read page may be omitted by causing the address information ADD to include information about the page. In the present specification, the address information ADD transmitted from the memory controller 20 to the memory device MD is one cycle. However, the address information ADD may be transmitted by a plurality of cycles (for example, five cycles).

In the read operation according to the embodiments, the voltage applied to the selected word line WL becomes the same voltage, for example, as the voltage of the signal line by which the driver circuit 106 supplies the voltage to the row decoder module 108. That is, the voltage applied to various wirings and the period during which the voltage is applied can be roughly known by examining the voltage of the corresponding signal line. When the voltage of the selected gate line, the word line, or the like are estimated from the voltages of the signal lines connected to the driver circuit 106, the voltage drop due to the transistor in the low decoder RD may be taken into consideration. In this case, the respective voltages of the selected gate line and the selected word line are lower than the voltage applied to the corresponding signal line by the voltage drop of the transistor.

In the present specification, the elements including the input/output circuit 101, the logic control circuit 103, the sequencer 104, the ready/busy control circuit 105, and the driver circuit 106 may be referred to as a "controller" or a "control circuit". For example, the sequencer 104 may be referred to as a "controller". Each register in the register set 102 may be referred to as a "storage circuit". In the present specification, the "connection" indicates electrical connection and does not exclude the use of another element between two connected elements. In the present specification, the "OFF state" indicates that the voltage less than the threshold voltage of the corresponding transistor is applied to the gate of the corresponding transistor, and for example, the flow of a minute current such as a leak current of the transistor is not excluded.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
a plurality of memory cell transistors configured to store a plurality of bit data, respectively;
a first word line connected to a plurality of first memory cell transistors among the plurality of memory cell transistors;
a controller configured to perform a loop process including repetition of a program loop, the program loop including a program operation and a first verification operation; and
a storage circuit configured to store status information, wherein the controller is configured to:
  perform the loop process, and then perform a second verification operation, and
  store first status data relating to a result of the loop process and store second status data relating to a result of the second verification operation in the storage circuit, in a write operation using the plurality of first memory cell transistors as targets.

2. The memory device according to claim 1,
wherein the plurality of bit data different from each other are allocated to a plurality of states set according to threshold voltages of memory cell transistors, and
wherein verification voltages used for verification reading included in the verification operations are set to the plurality of states, respectively, and
the controller is configured to perform verification reading with the plurality of states as targets in the plurality of times of the first verification operation included in the loop process, and to perform verification reading with at least one state among the plurality of states as a target in the second verification operation.

3. The memory device according to claim 1,
wherein, when a first status reading command is received from an external memory controller after the write operation, the controller is configured to transmit the result of an OR operation of the first status data and the second status data to the memory controller as a part of the status information.

4. The memory device according to claim 1,
wherein the number of states used as targets of verification reading in the second verification operation equals the number of states used as targets of verification reading in the first verification operation.

5. The memory device according to claim 1,
wherein the number of states used as verification targets in the second verification operation is less than the number of states used as targets of verification reading in the first verification operation.

6. The memory device according to claim 5,
wherein the plurality of first memory cell transistors are configured to store a plurality of page data corresponding to the plurality of bit data, respectively, and
the states used as the targets of the verification reading in the second verification operation correspond to states associated with read voltages used for reading at least one page data among the plurality of page data.

7. The memory device according to claim 1,
wherein the controller is configured to change verification voltages used in the states of the second verification operation to different settings from those of the first verification operation.

8. The memory device according to claim 1,
wherein the controller is configured to:
  determine a state in which the number of bits of verification fails is detected to be a first value or less by verification reading of the plurality of respective states in the first verification operation, as verification passes,
  determine a state in which the number of bits of verification fails is detected to be a second value or less by verification reading of the plurality of respective states in the second verification operation, as verification passes, and
  change the second value to a setting different from the first value.

9. The memory device according to claim 1, further comprising:
  a plurality of second memory cell transistors in the plurality of memory cell transistors and connected to the first word line;
  a plurality of first select transistors connected to the plurality of first memory cell transistors, respectively;
  a plurality of second select transistors connected to the plurality of second memory cell transistors, respectively;
  a first selection line connected to the plurality of first select transistors; and
  a second selection line connected to the plurality of second select transistors and being different from the first selection line,
  wherein the controller is configured to omit the second verification operation after performing the loop process in the write operation using the plurality of second memory cell transistors as targets.

10. The memory device according to claim 1, further comprising:
  a plurality of third memory cell transistors among the plurality of memory cell transistors and are respectively connected to the plurality of first memory cell transistors; and
  a second word line connected to the plurality of third memory cell transistors,
  wherein the controller is configured to omit the second verification operation after performing the loop process in the write operation using the plurality of third memory cell transistors as targets.

11. A memory system comprising:
the memory device according to claim 9; and
a memory controller configured to control the memory device,
wherein
  (i) a combination of commands for instructing the memory device to perform a write operation including the second verification operation by the memory controller, and
  (ii) a combination of commands for instructing the memory device to perform a write operation not including the second verification operation by the memory controller,
are different from each other.

12. The memory device according to claim 1,
wherein in the write operation, after the loop process, the controller is configured to:
  perform the second verification operation a plurality of times,
  store information relating to a status pass as the second status data when it is determined at least one time as a verification pass by respective results of the plurality of times of the second verification operation, and
  store information relating to a status fail as the second status data when all are determined as verification fails.

13. The memory device according to claim 1,
wherein, after the write operation, when a second status reading command is received from an external memory controller, the controller is configured to transmit the first status data and the second status data as a part of the status information to the memory controller.

14. A memory system, comprising:
the memory device according to claim 13; and
the memory controller is configured to control the memory device,
wherein the memory controller is configured to:
   receive the status information from the memory device after the second status reading command is transmitted to the memory device, and
   instruct the memory device to perform the second verification operation in which a setting of the verification voltage is changed, when detecting that information relating to a status fail is stored in the first status data, and information relating to a status pass is stored in the second status data.

15. The memory system according to claim 14,
wherein, when detecting that information on the status pass is stored in the second status data, the memory controller is configured to set a correction value of a read voltage in a read operation in which the first word line is selected based on the setting of the verification voltage used in the second verification operation corresponding to the status pass.

16. The memory device according to claim 1,
wherein the controller is configured to:
   perform second verification operations a plurality of times using different verification voltages after the loop process in the write operation, and
   store the plurality of second status data indicating respective results of the plurality of times of second verification operations in the storage circuit.

17. The memory device according to claim 16,
wherein when a second status reading command is received from an external memory controller after the write operation, the controller is configured to transmit the first status data and the plurality of second status data to the memory controller as a part of the status information.

18. A memory system comprising:
the memory device according to claim 17; and
a memory controller configured to control the memory device,
wherein the memory controller is configured to:
   transmit the second status reading command to the memory device,
   then receive the status information from the memory device, and
   set a correction value of a read voltage in the read operation in which the first word line is selected, based on the setting of a verification voltage used in the at least one second verification operation, in the memory device,
   when detecting that information relating to a status fail is stored in the first status data, and information relating to a status pass is stored in at least one of the plurality of second status data.

* * * * *